US006738964B1

(12) United States Patent
Zink et al.

(10) Patent No.: US 6,738,964 B1
(45) Date of Patent: May 18, 2004

(54) GRAPHICAL DEVELOPMENT SYSTEM AND METHOD

(75) Inventors: Edmund D. Zink, Plano, TX (US); Gerald K. Coley, Terrell, TX (US); Edward P. Kuzemchak, Avonmore, PA (US); John L. Tibbits, Centerville, OH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/523,577

(22) Filed: Mar. 10, 2000

Related U.S. Application Data

(60) Provisional application No. 60/168,295, filed on Dec. 1, 1999, provisional application No. 60/168,196, filed on Nov. 30, 1999, provisional application No. 60/168,198, filed on Nov. 30, 1999, provisional application No. 60/168,252, filed on Nov. 30, 1999, provisional application No. 60/168,253, filed on Nov. 30, 1999, provisional application No. 60/168,258, filed on Nov. 30, 1999, provisional application No. 60/168,250, filed on Nov. 3, 1999, and provisional application No. 60/123,776, filed on Mar. 11, 1999.

(51) Int. Cl.[7] .................................................. G06F 9/44
(52) U.S. Cl. ....................... 717/105; 717/109; 717/113; 717/115; 345/763; 345/769; 345/771
(58) Field of Search ................................ 717/107, 162, 717/105, 100, 113, 116, 117, 108, 109, 101–104, 115; 709/310–332; 712/17, 35, 36; 345/763, 769, 771

(56) References Cited

U.S. PATENT DOCUMENTS

| | | | | | |
|---|---|---|---|---|---|
| 5,386,568 | A | * | 1/1995 | Wold et al. | 717/162 |
| 5,590,349 | A | * | 12/1996 | Robinson et al. | 712/36 |
| 5,774,721 | A | * | 6/1998 | Robinson | 709/315 |
| 5,801,942 | A | * | 9/1998 | Nixon et al. | 700/83 |
| 5,850,548 | A | * | 12/1998 | Williams | 717/107 |
| 5,950,001 | A | * | 9/1999 | Hamilton et al. | 717/107 |
| 6,263,492 | B1 | * | 7/2001 | Fraley et al. | 717/107 |
| 6,437,805 | B1 | * | 8/2002 | Sojoodi et al. | 345/763 |

* cited by examiner

*Primary Examiner*—Antony Nguyen-Ba
(74) *Attorney, Agent, or Firm*—Robert D. Marshall, Jr.; W. James Brady, III; Frederick J. Telecky, Jr.

(57) ABSTRACT

A graphical solutions development system using placement of blocks representing hardware/software functionality on a computer screen drawing and connecting the blocks by wires representing data and control flow to create application programs and/or hardware design. The blocks are instances of development components that include intelligence for optimization within a detected environment. This permits effective programming of digital signal processors and system design by users not expert in digital signal processing programming and system design.

13 Claims, 32 Drawing Sheets

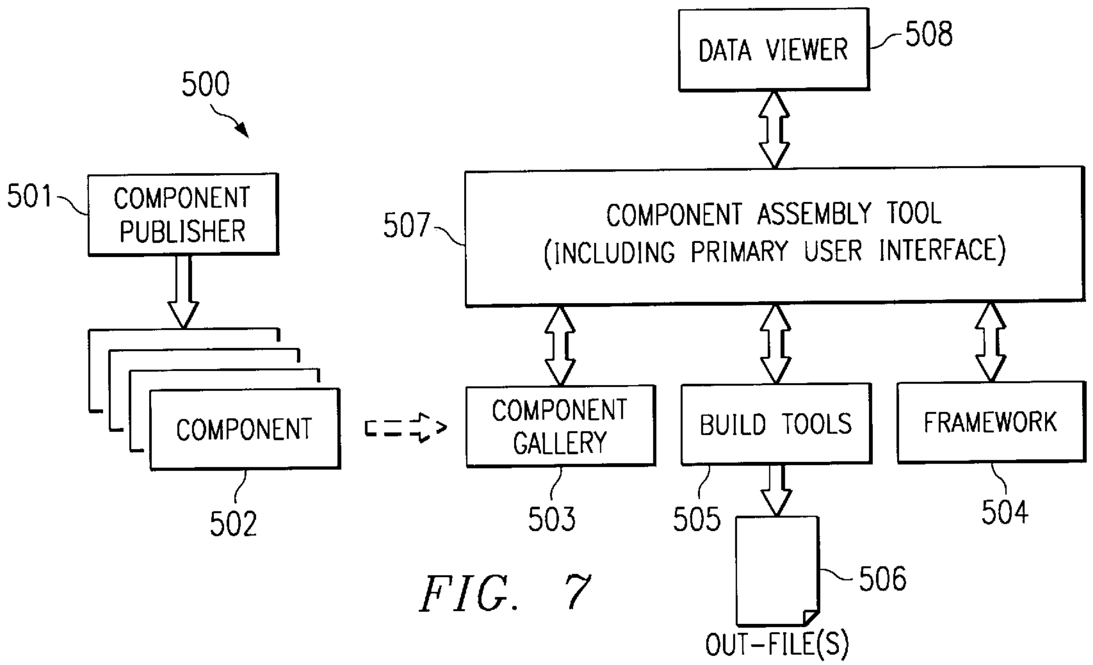
*FIG. 7*
*FIG. 8A*
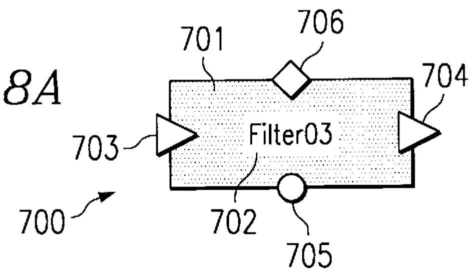
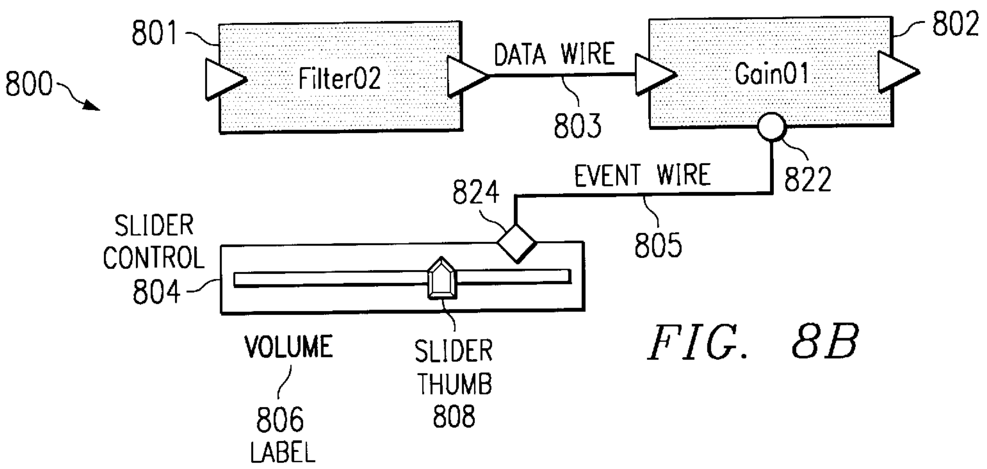
*FIG. 8B*

FIG. 8C

| PROPERTY NAME | PROPERTY VALUE |
|---|---|
| COMPONENT NAME | LOWPASS FILTER |
| FILENAME | {53108000-5BFB-11D2-B9E1-00600892CD76}.tik |
| COMPONENT CATEGORY | TELEPHONY |
| COMPONENT WEBSITE | http://www.tibio.com |
| RELEASE DATE | 4-22-99 |
| REVISION | 1.0.03 |
| VENDOR PART NUMBER | TIBIO-001-00461 |
| VENDOR NAME | TEXAS INSTRUMENTS INC. |
| VENDOR WEBSITE | http://www.ti.com |
| PROCESSOR | TMS320C5410 |
| FRAMEWORK | TELEPHONY-54-C |
| SAMPLE RATE MAX | 8000 |
| SAMPLE RATE MIN | 8000 |
| INPUT FREQUENCY MAX | 3.1 kHz |
| INPUT FREQUENCY MIN | 0 |
| PASSBAND GAIN | 0.0 dB |
| CUTOFF FREQUENCY | 1.2 kHz |

FIG. 8D

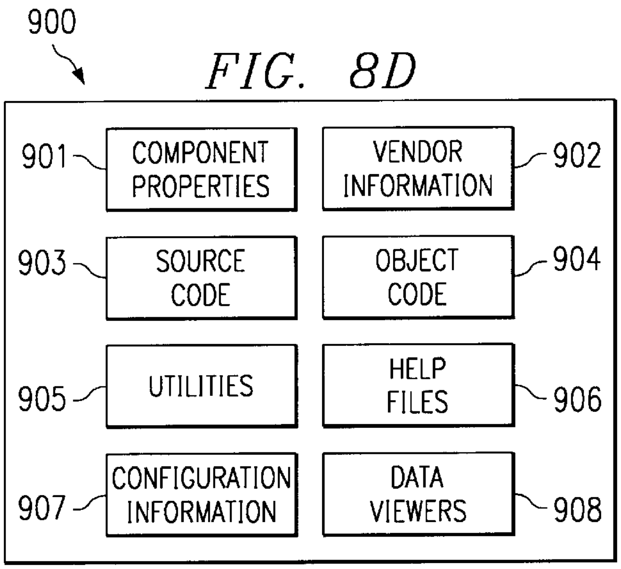

1300

1400

1500

| CATEGORY | RESOURCE |
|---|---|
| HEADER FILES | |
| | Sine.h |
| | Triangle.h |
| | Square.h |
| SOURCE FILES | |
| | Sine.c |
| | Triangle.c |
| | Square.c |
| OBJECT FILES | |
| | Sine.obj |
| | Triangle.obj |
| | Square.obj |
| HELP FILES | |
| | Sine.hlp |
| | Triangle.hlp |
| | Square.hlp |
| SCRIPT FILES | |
| | OnProperty.TSL |
| | OnLink.TSL |
| | OnRun.TSL |
| | |

```
'--------------------------------------------------------------
'  OnProperty Script for Component: Signal Generator
'--------------------------------------------------------------

Dim SelectedWaveform as Long

Const Sine     = 1
Const Triangle = 2
Const Square   = 3
Const OK       = -1
Const CANCEL   = 0

Result = ShowPropertyDialog   1601

Select Case Result
   Case OK
      pProject = GetMyProject
1602
      Select Case SelectedWaveform
         Case Sine
                CopyFileToProject sine.h, pProject
                CopyFileToProject sine.c, pProject
                CopyFileToProject sine.obj, pProject
 1603    Case Triangle
                CopyFileToProject triangle.h, pProject
                CopyFileToProject triangle.c, pProject
                CopyFileToProject triangle.obj, pProject
         Case Square
                CopyFileToProject square.h, pProject
                CopyFileToProject square.c, pProject
                CopyFileToProject square.obj, pProject
      End Select

   Case CANCEL   1604

End Select

End

Function ShowPropertyDialog

'  code here to generate the property dialog window
' (also sets SelectedWaveform variable)

End Function

'--------------------------------------------------------------
```

```
'--- OnProperty Script for Sine Generator ---------
' Comp Name     : Sine Generator
' Comp GUID     : xxx
' Platform      : TI C31 DSK
' Framework     : C31DSK-Audio
' Revision      : 1.0
' Date          : 11-19-98
' Comp Engineer : John Tibbits
'--------------------------------------

Option Explicit

Const OK = -1
Const CANCEL = 0
Dim Result As Long
Dim pThisBlock As Long ' pointer to this component instance
Dim BmpPath$           ' path for BMP files
Dim cBMP1$             ' file name for bmp in component
Dim Logo$              ' fully qualified path to TI logo

'--------------------------------------------
' This is the subroutine that Tibio calls whenever the property
' dialog needs to be displayed.
'--------------------------------------------

InitVariables          ' initialize any arrays or variables
ExportFiles            ' copy any files to a temp dir

'--------------------------------------------
' Code below generates a dialog window
'--------------------------------------------

Begin Dialog Dialog_1 15,15, 175, 102, "Sine Wave Generator", .DlgFunc

  GroupBox 4, 6, 110, 90, "Set Properties"
    Text      18, 24, 48, 12,  "Name"
    Text      18, 42, 48, 12,  "Label"
    Text      18, 60, 48, 12,  "Fout"
    Text      18, 78, 48, 12,  "Vout"
    TextBox   44, 22, 50, 12,  .InstanceName
    TextBox   44, 40, 50, 12,  .Label
    TextBox   44, 58, 50, 12,  .Fout
    TextBox   44, 76, 50, 12,  .Vout
  Picture 129, 56, 32, 32, Logo$, 0, .Logo
  OKButton 126, 10, 38, 11
  CancelButton 126, 26, 38, 11
End Dialog

Dim Dlg As Dialog_1                    ' instantiates a dialog window

Dlg.InstanceName = BLK_GetProperty (pThisBlock, "Name")
```

2301 (Begin Dialog … End Dialog)

FROM FIG. 17G-1

2302
```
If Dlg.InstanceName  =  "Untitled" Then  '  set default properties
    Dlg.InstanceName =  "SIN1"
    Dlg.Fout         =  "440"
    Dlg.Vout         =  "0.5"
Else                                     '  get current properties
    Dlg.Label = BLK_GetProperty (pThisBlock, "Label")
    Dlg.Fout  = BLK_GetProperty (pThisBlock, "Fout")
    Dlg.Vout  = BLK_GetProperty (pThisBlock, "Vout")
End If
```

2303
```
Result = Dialog(Dlg)                     '  displays the dialog box
Select Case Result
  Case OK                                '  send properties to Tibio
       BLK_SetProperty pThisBlock, "Name",  Dlg.InstanceName
       BLK_SetProperty pThisBlock, "Label", Dlg.Label
       BLK_SetProperty pThisBlock, "Fout",  Dlg.Fout
       BLK_SetProperty pThisBlock, "Vout",  Dlg.Vout
  Case CANCEL
End Select

End
'-------------------------------------------
'  The dialog box used above calls DlgFunc whenever the dialog
'  window is open.  This function monitors the mouse and
'  keystroke activity in the dialog box so that appropriate
'  actions can be taken.
'-------------------------------------------

Function DlgFunc (ControlID As String, Action As Integer, Suppvalue As Integer)
   Const INITIALIZE  = 1
   Const MOUSECLICK = 2
   Select Case Action
     Case = INITIALIZE
        DlgSetPicture "Logo", Logo$
     Case = MOUSECLICK
   End Select
End Function
'-------------------------------------------

Sub InitVariables
'-------------------------------------------
'  Initialize any variables or arrays
'-------------------------------------------

pThisBlock = TSL_GetThisBlock
cBMP1$ = "tilogo60.bmp"
BmpPath$ = TSL_GetPath("TIBIO\TEMP")

End Sub
```

*FIG. 17G-3*
FROM FIG. 17G-2

```
'_____
Sub ExportFiles
'_____
'   Export any files that may be needed.
'_____
Logo$ = BmpPath$ & "\" & cBMP1$
Result = TSL_ExportResource(cBMP1$, Logo$)
End Sub

'--------------End of File--------------
```

```
'_____
'   The AutoName function is called to create a unique block
'   instance name.
'_____
Function AutoName (shortname$) As String

      Dim NumBlocks   As Long
      Dim pBlock      As Long
      Dim pDrawing    As Long
4001  Dim pThisBlock  As Long
      Dim ThisGuid    As String
      Dim Comps       As Long
      Dim j           As Long

      pDrawing   = TSL_GetThisDrawing          ← 4002
      NumBlocks  = DRW_GetNumBlocks (pDrawing) ← 4003
4004← pThisBlock = TSL_GetThisBlock
      ThisGuid   = BLK_GetComponentGUID (pThisBlock) ← 4005
      Comps      = 0

      For j = 0 To NumBlocks-1
          pBlock = DRW_GetBlockByIndex (pDrawing, j) ← 4007
          If ThisGuid = BLK_GetComponentGUID (pBlock) Then ← 4008
4006         Comps = Comps + 1
          End If
      Next

      AutoName = shortname$ & Str (Comps)

End Function
```

```
'-----------------------------------------------------------------
'   OnDeposit Script for Sine Wave Generator
'-----------------------------------------------------------------

Option Explicit

Dim pThisBlock As Long          ' pointer to the component instance
Dim pWorkspace As Long          ' pointer to this workspace instance
Dim pProject As Long            ' pointer to this project instance

Function OnDeposit () As Integer

'--------------------------------------------------------
'   The OnDeposit function for every block is called early in the
'   "Build" process to give each block an opportunity to contribute
'   any files ( source, header, libraries, dlls, assembly, etc.) to
'   the project.
'--------------------------------------------------------

2401 { pThisBlock  = TSL_GetThisBlock ()
       pWorkspace = TSL_GetThisWorkspace ()
       pProject    = WRK_GetProjectByName (pWorkspace, "DspProcess")

'--------------------------------------------------------
'   Conditional statements, based on property settings, may be
'   inserted here if needed.
'--------------------------------------------------------

'--------------------------------------------------------
'   Here is syntax for statements below:
'
'   PRJ_AddResource Project, Component,  Comp-File,    Folder,    Dest-File)
'-----------------------------------------------------------------

2402 { PRJ_AddResource pProject, pThisBlock, "SinGen.obj",   "Object",  "SinGen.obj"
       PRJ_AddResource pProject, pThisBlock, "FeedBack.obj", "Object",  "FeedBack.obj"
       PRJ_AddResource pProject, pThisBlock, "SinGen.h",     "Include", "SinGen.h"
       PRJ_AddResource pProject, pThisBlock, "SinGen.c",     "Source",  "SinGen.c"
       PRJ_AddResource pProject, pThisBlock, "FeedBack.h",   "Include", "FeedBack.h"
       PRJ_AddResource pProject, pThisBlock, "Feedback.c",   "Source",  "FeedBack.c"
       PRJ_AddResource pProject, pThisBlock, "Math.h",       "Include", "Math.h"

OnDeposit = 1

End Function

'---------------- End of File -------------------
```

```
'--------------------------------------------------
'   OnAssemble Script for Sine Wave Generator
'--------------------------------------------------

Option Explicit

Dim pThisBlock As Long
Dim pWorkSpace As Long
Dim pProject As Long
Dim pFragmentMap As Long
Dim pPin As Long
Dim pWire As Long
Dim Process$
Dim ProcessA$
Dim Vout$
Dim FreqInCom$
Dim VolumeInCom$
Dim PropFout$
Dim PropVout$
Dim DeclareA$
Dim DeclareB$
Dim DeclareC$
Dim Init$
Dim BlockName$
Dim FreqVarName$
Dim VolumeVarName$
Const EvFreq = 0
Const EvLevel = 1

Function OnAssemble () As Integer

'----------------------------------------
'   Get name of block an pointers to block, project
'   and workspace.
'----------------------------------------

     pThisBlock  = TSL_GetThisBlock ()
2501 BlockName$ = BLK_GetProperty (pThisBlock, "Name")
     pWorkspace  = TSL_GetThisWorkspace ()
     pProject    = WRK_GetProjectByName (pWorkspace, "DspProcess")

'----------------------------------------
'   Get the variable name of the wire(s) that are
'   connected to the output of the sine wave generator.
'----------------------------------------

     pPin  = BLK_GetDataOutByIndex (pThisBlock, 0)
2502 pWire = PIN_GetWireByIndex (pPin,0)
     Vout$ = WIR_GetVarName (pWire)

'----------------------------------------
'   Get initial property values for the frequency and
```

FROM FIG. 17I-1

```
'   output level, as set by the user, from the property
'   dialog window.
'------------------------------------------

2503 { PropFout$ = BLK_GetProperty (pThisBlock, "Fout")   ' initial frequency
       PropVout$ = BLK_GetProperty (pThisBlock, "Vout")   ' initial output level
'------------------------------------------
'   Build unique variable names for the input events.
'   Since block names are by definition unique, these
'   even variable names are generated using the block
'   name.
'------------------------------------------
2504 { pPin = BLK_GetInputEventByIndex (pThisBlock, EvFreq)
       FreqInCom$ = PIN_GetPinName (pPin)

       pPin = BLK_GetInputEventByIndex (pThisBlock, EvLevel)
       VolumeInCom$ = PIn_GetPinName (pPin)

       FreqVarName$ = "f" & FreqInCom$ & BlockName$
       VolumeVarName$ = "f" & VolumeInCom$ & BlockName$
'------------------------------------------
'   DeclareA$, DeclareB$, Process$, Init$, and Process$ are lines of
'   C code that will be pasted into the DspMain.c file.  i.e. These
'   strings must be valid C code.  These declare strings will be the
'   declaration statements in the DspMain.c file that declare the
'   variable names associated with this instance.
'------------------------------------------
2505 { DeclareA$ = "CSinGen " & BlockName$ & " ;"
       DeclareB$ = "float " & FreqVarName$ & " = " & PropFout$ & " ;"
       DeclareC$ = "float" & VolumeVarName$ & " = " & PropVout$ & " ;"
'------------------------------------------
'   In the particular framework that this component was designed for,
'   each block must export an INIT function and a PROCESS function.
'   The init function performs any necessary initialization functions.
'   The process function will be called for each data sample, at the
'   sample-rate interval. The process function provides all mathematical
'   or logical operations that are to be applied to each sample. In
'   this case, the process function calculates the next discrete value
'   of the wave.
'------------------------------------------
2506 { Init$ = "SinGen_Init (&" & BlockName$ & ", " & PropFout$ & ", freqSampling) ;"
       Process$ = "SinGen_Process (&" & BlockName$ & ", " & FreqVarName$ & ",
         &" & Vout$ & ") ;"
       ProcessA$ = Vout$ & " *= " & VolumeVarName$ & " ; "
```

FROM FIG. 17I-2

```
'-----------------------------------------------
'   The AddFragment function below will place the lines of code that
'   were put-together above into DspMain.c file, in the appropriate sections.
'   Comments below correspond to Comments in the DspMain.c file.
'-----------------------------------------------

      pFragmentMap = PRJ_GetFragmentMap (pProject)
      FGM_AddFragment  pFragmentMap,  pThisBlock,  "Include",  "SinGen.h"  ' Line A
      FGM_AddFragment  pFragmentMap,  pThisBlock,  "Init",     Init$       ' Line B
      FGM_AddFragment  pFragmentMap,  pThisBlock,  "Declare",  DeclareA$   ' Line C
2507  FGM_AddFragment  pFragmentMap,  pThisBlock,  "Declare",  DeclareB$   ' Line D
      FGM_AddFragment  pFragmentMap,  pThisBlock,  "Declare",  DeclareC$   ' Line E
      FGM_AddFragment  pFragmentMap,  pThisBlock,  "Process",  Process$    ' Line F
      FGM_AddFragment  pFragmentMap,  pThisBlock,  "Process",  ProcessA$   ' Line G

End Function

'---------------- End of File --------------------
```

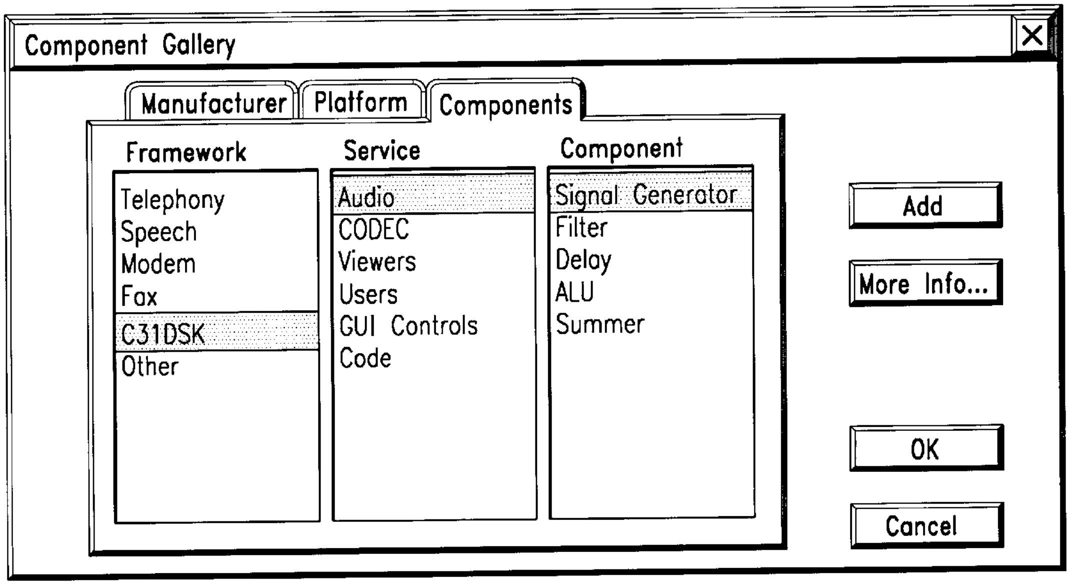

```
/* DspMain.c */

       #include "StdAfx.h"          /* always included by Tibio */
       #include "Aic.h"             /*  DAC */
2601   #include "SinGen.h"          /* SIN1 and SIN2 Line A  */
       #include "DspMain.h"         /* header file for drawing */

/*Wire Definitions */
       float fReq ;                 /* AicInput is always required */
2602   float S01 ;
       float S02 ;
       float S03 ;

/*Component Instances*/
       CSinGen SIN1 ;                               /* SIN1 Line C */
       float flFreqSIN1 = 200 ;                     /* SIN1 Line D */
2603   float flVolumeSIN1 = 0.4 ;                   /* SIN1 Line E */
       CSinGen SIN2 ;                               /* SIN2 Line C */
       float flFreqSIN2 = 201 ;                     /* SIN2 Line D */
       float flVolumeSIN2 = 0.4 ;                   /* SIN2 Line E */

       void OnCreate (float freqSampling)
       {
2604    SinGen_Init (&SIN1, 440, freqSampling) ;    /* SIN1 Line B */
        SinGen_Init (&SIN2, 201, freqSampling) ;    /* SIN2 Line B */
       }

       void OnProcess (float freqSampling)
       {
        fReq = AicInput () ;
        SinGen_Process (&SIN1, flfreqSIN1, &S01) ;  /* SIN1 Line F */
        S01 *= flVolumeSIN1 ;                       /* SIN1 Line G */
2605    SinGen_Process (&SIN2, flFreqSIN2, &S02) ;  /* SIN2 Line F */
        S02 *= flVolumeSIN2 ;                       /* SIN2 Line G */
        S03 = S01 + S02 ;                           /* ALU1 OnAssemble script */
        AicOutput (S03) ;                           /* DAC OnAssemble script */
       }

/* --------------- End of File ----------------*/
```

| RULE NUMBER | RULE DEFINITION |
|---|---|
| B000 | EVERY BLOCK MUST HAVE A "PROJECT" ATTRIBUTE |
| B001 | EVERY BLOCK'S PROJECT ATTRIBUTE MUST HAVE SAME VALUE |
| B002 | EVERY BLOCK MUST HAVE A UNIQUE INSTANCE NAME |
| B003 | ALL BLOCK PROPERTIES MUST BE WITHIN ALLOWABLE MAX-MIN RANGE |

```
'-----------------------------------------------------------
'   Framework Rule B000 : Every block must have a "project" attribute.
'-----------------------------------------------------------

Function CheckRule_B000 (pProject) as Long

'   Function returns true is all blocks in project
'   have a "project attribute.

Dim NumberOfBlocksInProject as Long
Dim iBlock as Long
Dim Result as Long

Result = True
NumberOfBlocksInProject = GetNumBlocks (pProject)  2901

For iBlock = 0 To NumberOfBlocksInProject - 1  2902

    If Not VerifyAttributeExists (iBlock, "Project") Then  2903
      Result = False
    End If

Next iBlock

CheckRule_B000 = Result

End Function
```

```
'---------------------------------------
'   Check all Block Rules
'---------------------------------------

Sub CheckBlockRules (pProject)

Dim Result as Long

Result = CheckRule_B000 (pProject)
If NOT Result Then Msgbox "Warning:  Rule violation: B000"

Result = CheckRule_B001 (pProject)
If NOT Result Then MsgBox "Warning:  Rule violation: B001"

Result = CheckRule_B002 (pProject)
If NOT Result Then MsgBox "Warning:  Rule violation: B002"

Result = CheckRule_B003 (pProject)
If NOT Result Then MsgBox "Warning:  Rule Violation: B003"

End Sub
'---------------------------------------
```

```
'---------------------------------------
'   Code for a simple Framework
'---------------------------------------

'   This framework checks rules that pertain to
'   workspaces, projects, blocks, and wires.

'   pWorkspace is a pointer to a workspace
'   pProject is a pointer to a project


CheckWorkSpaceRules  pWorkspace
CheckProjectRules    pProject
CheckBlockRules      pProject
CheckWireRules       pProject

'---------------------------------------
```

```
'-----------------------------------------------------------
'   Framework Rule P003 : Every pin must have a unique name.
'-----------------------------------------------------------

Function CheckRule_P003 (pComponentInPublisher) as Long

'   Function returns true is all pins on a block
'   or on a component have a unique name.

Dim NumberOfPins as Long
Dim iPin as Long
Dim pPin as Long
Dim iTestPin as Long
Dim pTestPin as Long
Dim Result as Long
Dim TempName as String

Result = True
NumberOfPins = ObjectGetNumPins (pComponentInPublisher)   3801

For iPin = 0 To NumberOfPins - 1   3802
   pPin      = GetPinByIndex (iPin)
   TempName = GetPinName (pPin)
   For iTestPin = NumberOfPins - 1 To iPin + 1 Step -1   3803
      pTestPin = GetPinByIndex (iTestPin)
      If (TempName = GetPinName (pTestPin)) Then
         Result = False
         Exit For
      End If
      Next iTestPin
   If NOT Result Then Exit For
   Msgbox "Duplicate pins named: " & TempName
Next iPin

CheckRule_P003 = Result

End Function
-----------------------------------------------------------
```

```
/*  Proxy code for sending three output events using shared memory */

void ControlObjectX (int a, int b, int c)
{
      char * pBuffer = GetBuffer () ;
      PutInt (pBuffer, a) ;
      PutInt (pBuffer, b) ;
      PutInt (pBuffer, c) ;
}
```

FIG. 25B

```
/*  Stub code for receiving three input events using shared memory */

void stubControlObjectX ()
{
      char * pBuffer = GetBuffer () ;
      int a = GetInt (pBuffer) ;
      int b = GetInt (pBuffer) ;
      int c = GetInt (pBuffer) ;

      ControlObjectX (a, b, c) ;

}
```

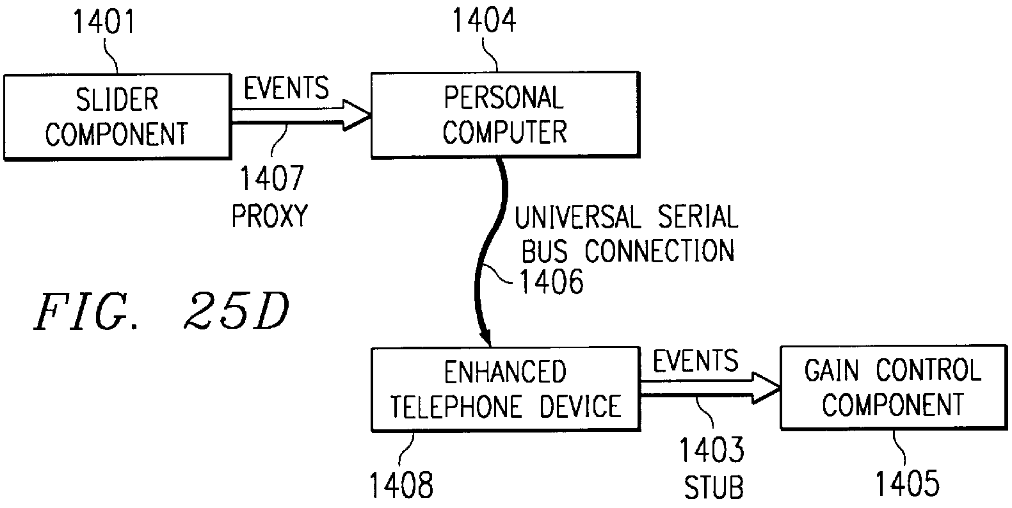

FIG. 25D

```
/* Proxy code for sending three output events using USB channel */

void ControlObjectX (int a, int b, int c)
{
    char * pBuffer = GetBuffer () ;
    PutPort (pBuffer, a) ;
    PutPort (pBuffer, b) ;
    PutPort (pBuffer, c) ;
}
```

*FIG. 25E*

```
/* Stub code for receiving three input events using USB channel */

void stubControlObjectX ()
{
    char * pBuffer = GetBuffer () ;
    int a = GetPort (pBuffer) ;
    int b = GetPort (pBuffer) ;
    int c = GetPort (pBuffer) ;

    ControlObjectX (a, b, c) ;
}
```

*FIG. 25F*

GRAPHICAL DEVELOPMENT SYSTEM AND METHOD

This application claims priority from provisional application Serial No. 60/123,776, filed Mar. 11, 1999, and CLAIMS BENEFIT OF PROVISIONAL APPLICATION SERIAL NO. 60/168,295, FILED Dec. 1, 1999, and claims benefit of Serial No. 60/168,196 filed Nov. 30, 1999, and claims benefit of No. 60/168,198 filed Nov. 30, 1999, and claims benefit of No. 60/168,252 filed Nov. 30, 1999 and claims benefit of No. 60/168,253 filed Nov. 30, 1999 and claims benefit of No. 60/168,250 filed Nov. 3, 1999 and claims benefit of No. 60/168,258 filed Nov. 30, 1999.

FIELD OF THE INVENTION

The invention relates to electronic devices, and, more particularly, to software and hybrid hardware/software development and systems and methods.

BACKGROUND OF THE INVENTION

The expanding use of computers and embedded processors increasingly demands customized applications specific to the requirements of particular users. This has led to the widespread employment of visual builder tools for creating custom application programs through the interlinking of software modules from libraries.

For example, Visual Basic for Applications from Microsoft Corporation and C++ Builder from Borland International provide visual environments that have a graphical user interface (GUI) and include a toolbox with different classes of components (software modules), form windows for combining components visually, and property sheets for the components that can be modified to customize the components. U.S. Pat. No. 5,850,548 and U.S. Pat. No. 5,950,001 illustrate variations of visual development environments. However, the known visual development methods have problems including limited component intelligence and flexibility.

SUMMARY OF THE INVENTION

The present invention provides a graphical development system for software or software/hardware hybrids with intelligent development components appropriate for real-time processors plus development framework rules to insure development component object optimization within the resulting application program. This has advantages including program development of digital signal processor applications by non-specialist programmers.

BRIEF DESCRIPTION OF THE DRAWINGS

Particular embodiments in accordance with the invention will now be described, by way of example only, and with reference to the accompanying drawings in which like reference signs are used to denote like parts and in which:

FIG. 7 illustrates an embodiment of a graphical solutions development system in block form;

FIGS. 8A–8D illustrate aspects of a development component;

FIGS. 16A–16C illustrate multiple code modules in a development component;

FIGS. 17A–17J show a development drawing, property dialogs, and code;

FIG. 18 presents a development component gallery;

FIGS. 19A–19D illustrate a development framework;

FIG. 21 illustrates a framework rule;

FIG. 23 presents an example of environment inquiry code;

FIGS. 25A–25F illustrate development component scripts.

Corresponding numerals and symbols in the different figures and tables refer to corresponding parts unless otherwise indicated.

DETAILED DESCRIPTION OF EMBODIMENTS OF THE INVENTION

A need has been identified for a graphical solutions development system (integrated development environment) with a library of development components that, in addition to software code for performing their functionalities, also include design information and environmental detection for automatic optimization. FIG. 7 shows a block diagram of an embodiment. Hybrid hardware/software functionalities are included in the solutions that can be developed. The typical application developed runs on a real-time processor such as a digital signal processor (DSP). The application may concurrently run on a general-purpose processor and may communicate with a host processor. Frameworks for graphical solutions development include constraints to insure automatic optimization.

Figure 1:
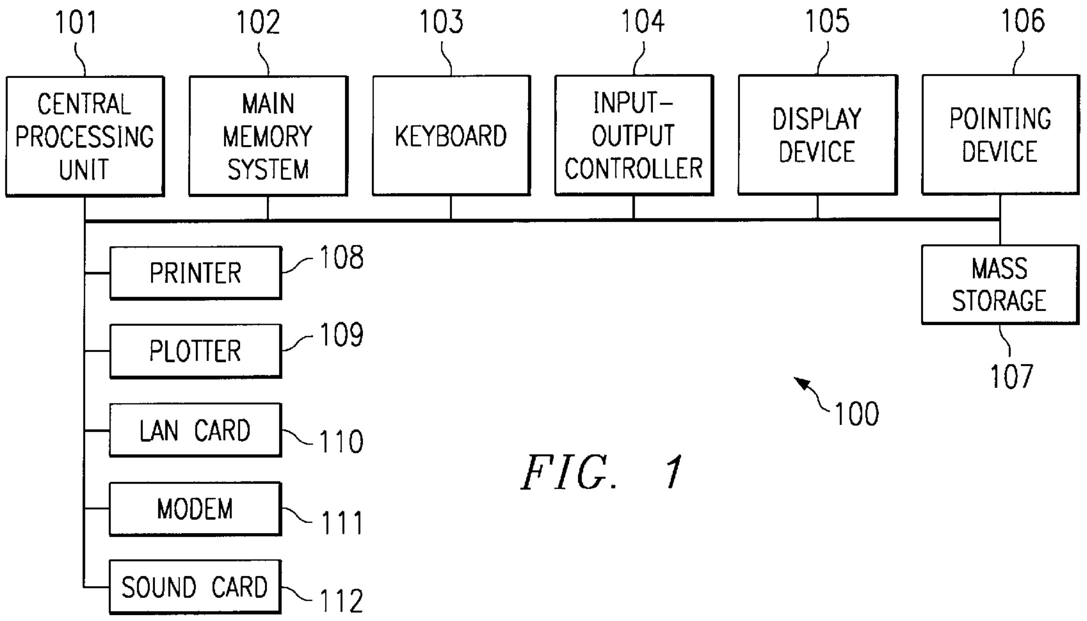
FIGS. 1–5 show computer systems and software in block form.

An embodiment of the development system may be implemented on a main computer system such as system 100 of FIG. 1. System 100 comprises at least one central processor 101, a main memory system 102, a keyboard 103, an input/output controller 104, a display device 105, a pointing device 106 (e.g. a trackball, a mouse, or a pressure-sensitive tablet with corresponding pen device), and a mass storage device 107 (e.g. a hard-disk drive). System 100 may also include peripheral devices such as a printer 108, a plotter 109, a local area network (LAN) connection 110, a modem 111, and a sound card 112.

Figure 2:
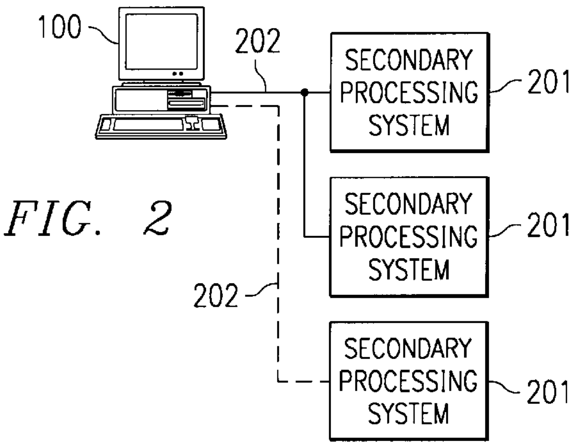

As shown in FIG. 2, system 100 may include one or more secondary (or target) processing systems 201, where each secondary processing system may or may not be in physical proximity to the main computing system. Further, the secondary processing system may or may not be electrically connected to the main computing system. For purposes of clarification, and if desired, connections 202 between the main computing system and the target computing system may be implemented in a number of different ways, which include but are not limited to: direct electrical connection via a serial cable, direction electrical connection via a parallel port cable, direct electrical connection via a universal serial bus (USB) cable, connection via optical fiber, connection via a local area network, connection via the Internet (or other wide area network), connection via radio frequency (RF) communication channel, or via direct connection to a shared bus or shared memory.

Figure 3:
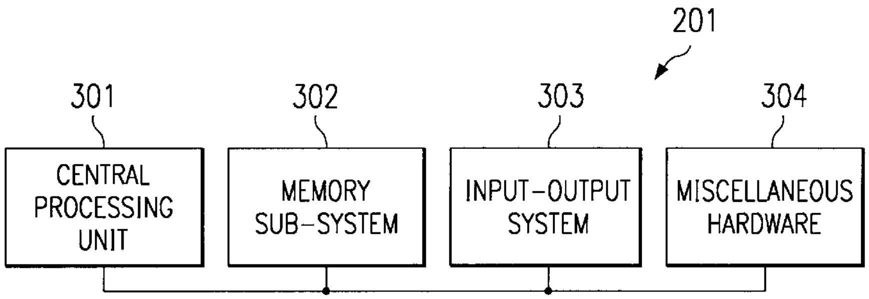

As illustrated in FIG. 3, a secondary processing system 201 is comprised of at least one central processing unit 301 which may include (or be electrically connected to) a memory subsystem 302, an input/output system 303, and other miscellaneous hardware 304. The central processing unit 301 on a secondary processing system is not required to match the processing unit 101 on system 100. Also, in instances where there is more than one secondary processing system, the central processing units 301 on the secondary processing systems may be identical, or similar, or completely different. Each secondary processing system may execute a single dedicated task, or may execute a variety of tasks under the supervision of an operating system (or the functional equivalent of an operating system).

Figure 4:
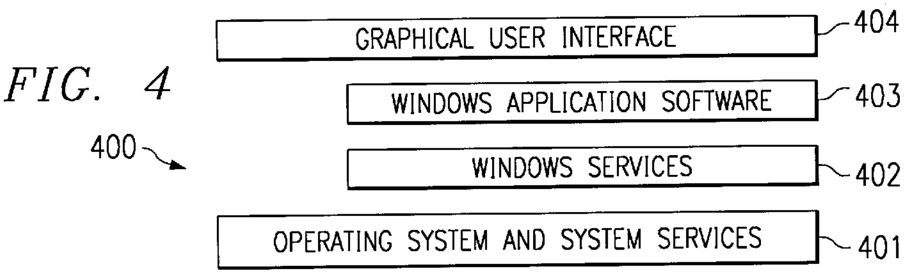

FIG. 4 illustrates the software system with which system 100 of FIG. 1 is equipped. The software system includes operating system (OS) 401 that provides a set of basic system services. The software system may be stored on hard disk drive 107 of system 100 and essential pieces of the software system are loaded into random-access memory (RAM) as they are needed. Some portions (or all) of the software system may be accessed via a local area network, the Internet, or other remote means. The software system includes a graphical user interface 404 for receiving user commands and to provide feedback (or results) to the user. In a typical scenario, the user interface is provided by application software such as application software or windows application software 403. This graphical user interface is normally provided by the application and/or by windowing service 402 that runs on a suitable operating system 401. In one embodiment, Microsoft Windows NT implements both the operating system 401 and the windows shell 402.

Figure 5:
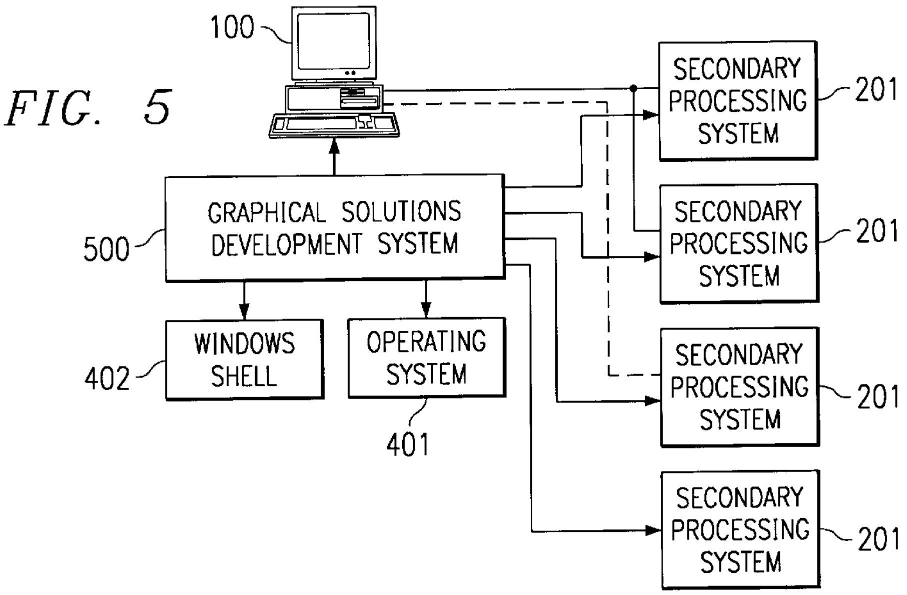

FIG. 5 illustrates system 100 equipped with graphical solutions development system (GSDS) 500 to assist users in the task of creating software programs. As shown, graphical solutions development system 500 interfaces to system 100, as well as to various secondary-processing systems 201, via the operating system 401 and the windows shell 402.

Figure 6:
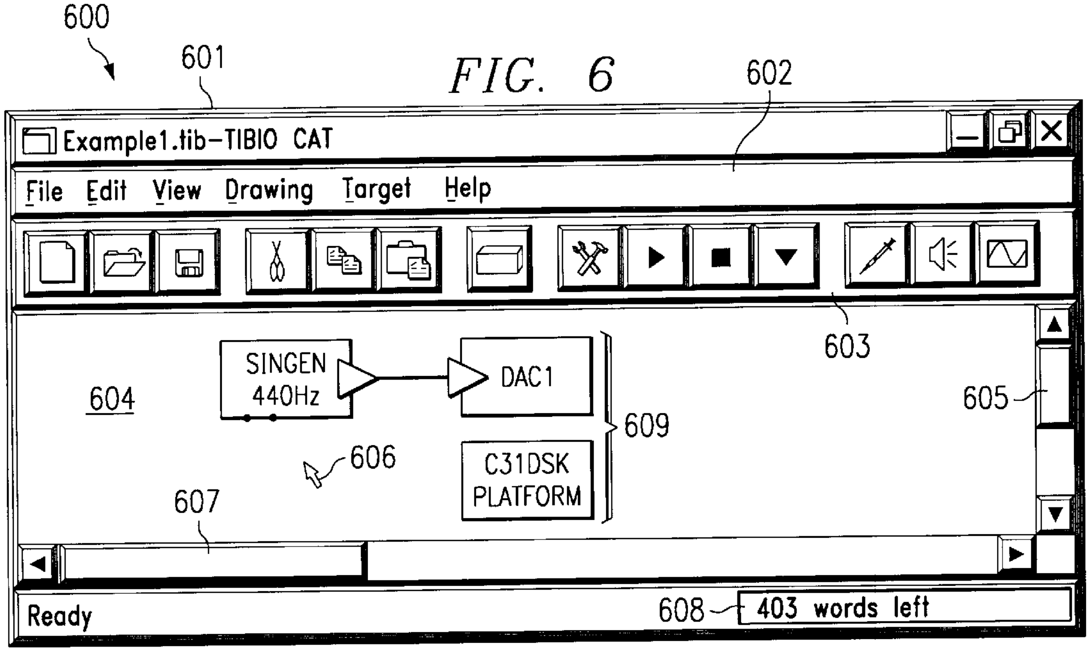
FIG. 6 is a screen shot illustrating generic screen elements.

FIG. 6 illustrates a user interface for graphical solutions development system 500. Visual workspace 600 is suitable for displaying fully annotated graphical drawings including block diagrams for electrical hardware and block diagrams of software. Visual workspace 600 may be rectangular or may be presented using other shapes. In general, visual workspace 600 presents the following visual interactive elements: title bar 601, menu bar 602, tool bar 603, client area 604, status bar 608, as well as a vertical scrollbar 605 and a horizontal scrollbar 607. Visual workspace 600 may be resizable or may have fixed screen dimensions.

A screen cursor 606 is normally provided by the windowing system or operating system, but it may be implemented in the application. The screen cursor 606 moves on the screen corresponding to movement of the pointing device 106 of FIG. 1. This provides the user with a convenient means of graphically accessing screen objects and also provides a means for controlling objects represented on the screen. The screen cursor 606 can provide additional information to the user by changing color or shape. Before, during, or after moving the cursor (via movement of the pointing device), the user may generate user-event signals (e.g. mouse "clicks" or "drags") that represent commands to the graphical solutions development system. Various user operations are accessed via either mouse operations or keyboard entries. For convenience many user operations may be accessed in more than one way (e.g. "copying" a drawing block by "clicking" on the "Copy" icon located on the tool bar 603, entering keystrokes via the keyboard to access the "Edit" menu, or using keystroke accelerators ("hot-keys") to invoke a copy operation).

Title bar 601 normally presents text that gives both the name of the application (e.g. "TIBIO CAT") and the current drawing name (e.g. "Example1.tib").

Menu bar 602 provides access to a set of drop-down menus that provide many useful functions like adding components to the drawing, saving the drawing, and configuring the target hardware.

Tool bar 603 provides a row of icon-buttons to permit rapid access to functions that are most commonly used. In this example, the tool bar functions from left to right are: new drawing, open a file, save the drawing, cut, copy, paste, add a component to the drawing, build, run, stop, reset the target hardware, add a probe, add an audio probe, and lastly, turn on the data viewer. It is common to provide more than one tool bar.

Client area 604 is available to the user to construct (or present) block drawings that represent solutions. The actual dimensions of a drawing may exceed the client area 604; the scrollbars 605 and 607 permit the user to access portions of the drawing that may not otherwise be visible.

Status bar 608 is a portion of the screen that is used for posting short status messages and status icons.

The user has the option to suppress or make visible menu bar 602, tool bar 603, and status bar 608.

Graphical solutions development system 500 of FIG. 5 comprises a graphical programming environment that facilitates rapid solution development through the use of pre-engineered components. The client area 604 provided by graphical solutions development system 500 represents a piece of paper where the user may "draw" (i.e. draft) a solution. The resulting user-generated drawing 609 represents a solution, which may be an aggregate of both hardware functions and software functions. Graphical solutions development system 500 provides a rich set of resources to assist in building a solution. These resources include a variety of components, means to interconnect components (referred to as "wires"), and many others. These resources effectively permit a user to "draw" a "block diagram" in the client area 604 on display device 105 of FIG. 1. This enables the user to "draw" a block diagram (on a computer screen) comprised of distinct software functional units as well as distinct hardware functional units. The resulting block diagram is referred to as a drawing.

There are several terms and constructs that have specific definitions in the graphical solutions development environment. Table 1 presents these terms and their corresponding definitions.

TABLE 1

| | |
|---|---|
| Block | An instance of a component; maintains persistent property information. A block nominally represents a functional unit, which may include a software function or algorithm, a hardware function, and/or some other functionality |
| Component | A self-contained deployable unit of primary functionality. Primary functionality refers to, but is not limited to, algorithms, mathematical |

TABLE 1-continued

| | |
|---|---|
| | functions, and control functions, which may be executed in either hardware or software. A component may also contain resources that provide secondary functionality, such as configuration, help, etc. |
| Component Gallery | An applet provided by the integrated development environment (IDE) that provides a sorted list of available components or component-tokens |
| Component-Token | A component featuring restricted primary functionality. A component-token may be distributed for marketing or promotional purposes. The primary functionality of a component-token may be totally void, it may be partially disabled, or it may be provided via an emulator. |
| Drawing | The visual representation of a block diagram on the display screen |
| Framework | A collection of rules and a software applet that can check for rule violations. |
| Pin | An abstraction for the input connection points to or output connection points from a component |
| Platform | An abstraction that represents a target hardware assembly |
| Probe | An abstraction for an oscilloscope (or other) probe |
| Project | An abstraction for the software associated with a single processor |
| Viewer | An applet that provides a visual (or other sensory) representation of data |
| Wire | An abstraction for visually denoting data or control flow |
| Workspace | An abstraction for a collection of software projects |

FIG. 7 provides an overall block diagram of graphical solutions development system 500. Because the ultimate goal is to provide the user with a powerful graphical design capability based on pre-engineered components, the initial task is to provide the ability to create compatible components. The component publisher 501 is an applet designed to create fully compatible components 502. The component publisher 501 creates a sequence of dialog windows (i.e. a wizard) that is designed to gather relevant information from the user regarding the component being published. Information supplied by the component creator may include the name of the component, the date of publication, the revision number, resources that need to be included to assure primary functionality, interfaces, and other miscellaneous items. When the dialog with the user is completed, component publisher 501 employs a standardized formatting procedure to package all of the information and resources into a single convenient file.

Component gallery 503 provides a list of all components that are available to the user. The components listed in component gallery 503 may have been locally published, may have been purchased from commercial component vendors, may have been downloaded via the Internet, or acquired by other means. Regardless of how they were acquired, they will all be listed in the component gallery. In an embodiment, component gallery 503 will provide additional features, which may include sorting components based on user-defined preferences, providing descriptive information about each component, and direct Internet access to additional vendor information. The components that appear in component gallery 503 do not have to reside on the local machine. In addition, component gallery 503 may list component tokens.

Component-tokens are components where some of the functionality has been removed or disabled. In one sense, component-tokens may be considered as an electronic brochure for a real component. Component tokens provide several interesting possibilities: 1) they may be distributed at no charge for promotional purposes; 2) they may provide limited functionality or no functionality; and 3) they may provide a local stub that can point to the real component. Component tokens are published exactly the same way that normal components are created, with two small exceptions: 1) some of the resources may be removed or disabled; and 2) a token attribute is set. The token attribute is a means for all tools that access or use components to recognize that this particular component is a token. A hyperlink to an Internet website may be included in a component-token to assist users in getting additional information or in upgrading component-tokens to "full-strength" components.

Figure 17A:
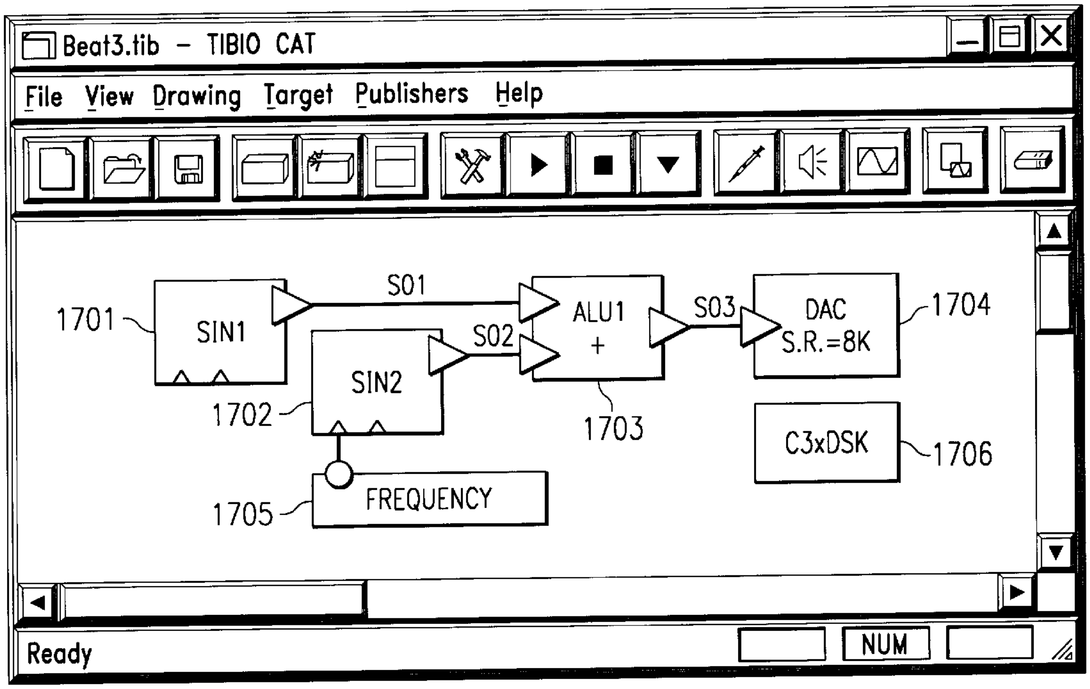
Figure 22A:
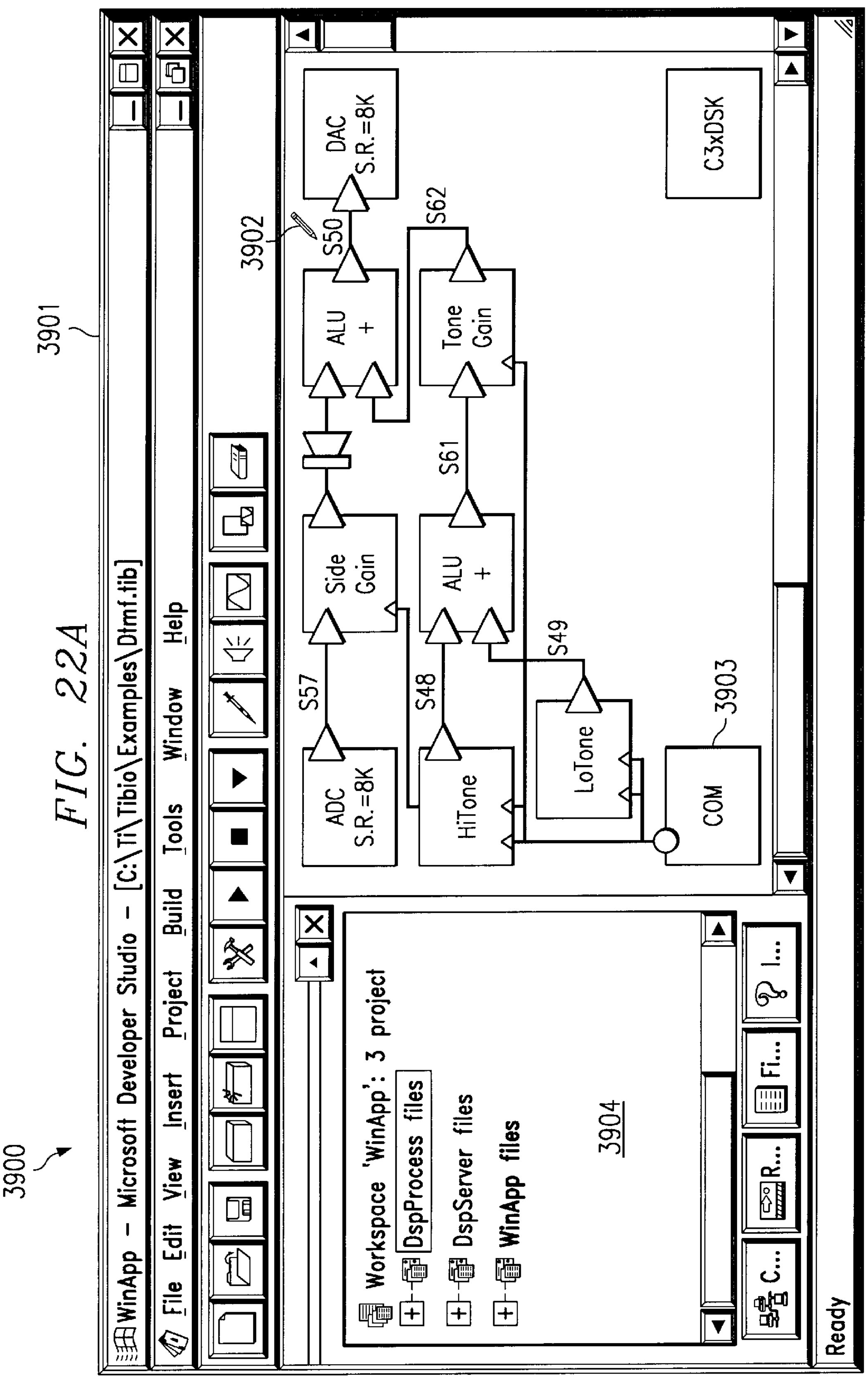
FIGS. 22A–22C show a development drawing and probes.

Component assembly tool 507 provides the primary user interface for graphical solutions development system 500. In the jargon of component-based software, the term "component assembly" refers to the composition or aggregation of components into a higher-level solution. Component assembly tool 507 is therefore a graphical "drag-and-drop" editor that is specifically optimized to facilitate "component assembly". FIGS. 6, 17A, and 22A illustrate screen shots of drawings in which various components have been dropped. Besides offering the user a graphical drawing environment, component assembly tool 507 provides an extended user interface that permits the user to build, load, run, and debug complex projects.

During the design phase, sometimes referred to as "design capture", the designer has many opportunities to make errors. These can be as simple as forgetting to use unique names for each component instance (block) on the drawing. To help the user avoid mistakes, especially new users, the graphical solutions development system includes framework 504. Framework 504 is defined as a collection of rules and a rule engine that can detect rule violations. This is very analogous to the spell-checker in a word-processor. A spell-checker is comprised of a set of rules (i.e. the dictionary) and the spell-check engine. The "dictionary" provides rules regarding spelling and hyphenation. The spell-check engine compares each word in a document to the words in the dictionary. Similarly, one part of framework 504 consists of a set of rules that are compiled by experts. The other part of framework 504 is an applet that can apply the rules to the current drawing and detect errors.

Component assembly tool 507 also provides an interface to code-generation and other build tools 505. This facility permits the project or projects to be compiled, assembled, linked, built, or it can invoke any other build process needed. Each component includes some embedded build information. Output files 506, which are the result of the build process, can be directly loaded into appropriate target platforms, or may be manually loaded into target platforms. Data viewer applets 508 provide a capability similar to an oscilloscope and thus permit the user to visually inspect a project while it is "running". This capability facilitates both debugging and performance assessment.

Components are self-contained, deployable units of software or hardware functionality. After a component is instantiated in a drawing, it is symbolically portrayed on display device 105 of FIG. 1 as either a line drawing or as an image (bitmap icon). (A component instance is often referred to as a "block".) FIG. 8A illustrates one possible rendering of a component instance (i.e. block), as it would appear in a drawing. The component instance illustrated in FIG. 8A comprises body 701 and a collection of optional pins that are usually located around the periphery of the block's body. Body 701 serves to denote an entity. It may be rendered on display device 105 using a fill color, a texture, or other fill means. The particular "fill method" may vary from one block to the next. The "fill color" may be used to visually connote a particular block property (e.g. red may denote an error condition). The "fill color" or other visual attributes may be changed dynamically in response to various operating or environmental "conditions". A block usually includes text field 702 that can provide useful reference information such as the instance name.

A block may have four different kinds of pins, which are visually rendered using small, distinct icons. Data-input pin 703 represents a connection point where data, especially real-time data, may be applied as an input parameter to the functionality of the block. Data output pin 704 represents a connection point for data, especially real-time data, after it has been processed by the block's algorithm or function. Wires representing events or control information may be connected at input event pin 705. Output events that result as a consequence of the block's normal processing operation (e.g. execution of an algorithm) "appear" at output event pin 706, where they may be connected via wires to other blocks.

A block may have any number (including zero) of each type of pin. The shape of the icon used to denote a pin is merely a visual cue for the user. Any pin may be located at any position along the periphery of the block. Pin colors as well as pin icons may be changed dynamically to visually connote changes in properties or environmental "conditions". For example, the fill color of a pin may be changed to red to denote that no wire is connected (where a wire was expected).

The drawing of FIG. 8B illustrates the interconnection of three blocks using an abstraction referred to as wires. Wire 803 visually depicts the fact that output data from filter block 801 is to be used as input data for the processing operation performed by gain block 802. In a similar manner, wire 805 illustrates that data events from the slider control are "fed" to the input event pin of gain block 802. Slider control 804 is activated by using pointing device 106 of FIG. 1 to move the slider "thumb". Movement of the slider thumb generates output events that provide thumb position information. Note that the software that implements the slider control may be executing on system 100, while the signal processing operations performed by filter block 801 and gain block 802 may be executing on a secondary processing system. The important point here is that wires may span blocks associated with diverse physical hardware. Label 806 is an annotation component. Annotation components are a special class of Components that do not contribute code to a project. Annotation components are used to add descriptive information to a drawing. Annotation components include lines, arrows, textboxes, labels, icons, title boxes, etc.

Each component includes a set of properties. FIG. 8C provides a table of example properties for a simple low pass filter component. Most of these properties are defined when the component is created. Some properties are used only at design-time, some are used only at build-time, and some are used only at run-time. The component creator determines what properties will be included, whether they can be modified, and when they are accessible.

In addition to a set of properties, a component may include many other objects or kinds of information. The drawing of FIG. 8D shows some of the possibilities. Component properties 901 were described earlier. Vendor information 902 may include contacts, technical support information, promotional information for other component-related offerings, legal notices, etc. Source code files 903 and object code files 904 may also be included. For the protection of the vendor's intellectual property, the component may be distributed without the inclusion of any source code files. Utilities 905 may include other components, test applications, specialized compilers, or any other utility that the component creator wishes to include. Help files 906 may include hypertext document files, text files, troubleshooting guides, application notes, etc. Configuration information 907 refers mainly to scripts. Scripts are brief code modules that can be executed by the GSDS to assist the GSDS in properly using and configuring each component instance in each individual environmental context. Configuration information may also include makefile information, memory requirements, data format information, operating system preferences, etc. If the component deals with a non-standard (or proprietary) type of data, then specialized data viewers 908 may be included inside the component. Many other objects may also be included in a component.

Components are the "building blocks" that are used to construct a solution to a problem. The use of a "block diagram" drawing paradigm greatly enhances the user's ability to understand the high-level operation of a drawing. Many other formats, both graphical and non-graphical, are possible. Indeed, an expanded list of properties such as those in FIG. 8C could take the place of the graphical representation of FIG. 8A where the expanded list would include input and output connections by references to other lists, and so forth.

Figure 9:
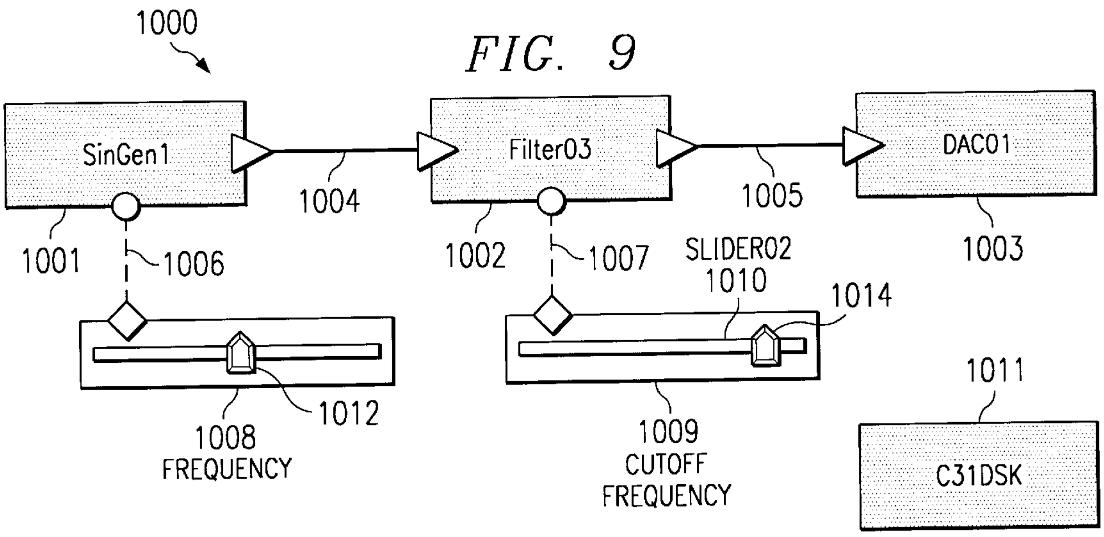
FIG. 9 illustrates a development drawing.

The GSDS distinctly renders drawings featuring two different kinds of information, data-flow information and control information. The distinction between data-flow and control-flow may be visually represented using wires of one color for data-flow, and of a different color for control-flow. FIG. 9 presents a simple, but complete, functional drawing. In FIG. 9, data-flow information (i.e. data wires 1004 and 1005) is rendered using solid lines. Control-flow information is depicted using dotted lines for control wires 1006 and 1007. Wires shown on the display screen do not connote electrical connections, but rather illustrate the flow of both data and control information.

In FIG. 9, sine wave generator 1001 represents a code module that, when executed, mathematically computes discrete samples of a sinusoidal signal. The numerical data for each sample generated by sine wave generator 1001 is used as input data for filter algorithm 1002. This "flow of information" from one algorithm to the next is perfectly analogous to analog signal processing where the output of one analog processing circuit (or "block") is connected via a wire to the input of the next analog processing circuit. For this reason, it is natural to depict the flow of data from sine wave generator 1001 to filter algorithm 1002 symbolically as wire 1004. Using this convention, the computed data out of filter algorithm 1002 is "connected" to digital-to-analog converter (DAC) 1003 using another wire 1005. Wires 1004 and 1005 visually connote a data path (i.e. data-flow). The frequency property of sine wave generator 1001 may be modified by the user, while the system is in operation, via frequency slider control 1008. Movement of slider thumb 1012 generates slider events that are forwarded to sine wave generator 1001 via wire 1006. Filter algorithm 1002 is configured in a similar manner so that the cut-off frequency of the filter may be modified (at run-time by the user) by moving slider thumb 1014 of freqency slider 1009. Control events from frequency slider 1009 are connected to filter algorithm 1002. Event wires 1006 and 1007 depict control-flow information. Distinctly showing the data-flow and control-flow information is an improvement that helps the user comprehend complex processing operations using very simple schematic representations. Platform block 1011 represents the actual hardware where this drawing will execute.

Platform block 1011 includes an operating kernel and a variety of build information.

Data-flow information pertains to data that must be processed such that various operations are completed in compliance with real-time deadlines (e.g. filtering of an audio data stream) where violations of the real-time deadlines may cause problems or failures (e.g. failure to maintain real-time filtering of an audio stream can cause pops, clicks, or dropouts).

Figure 10A:
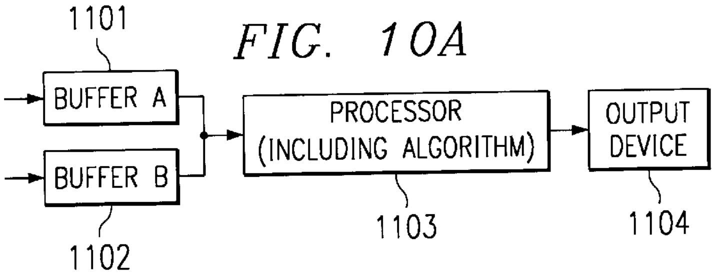
FIGS. 10A–10C show aspects of real-time operation.
Figure 10B:
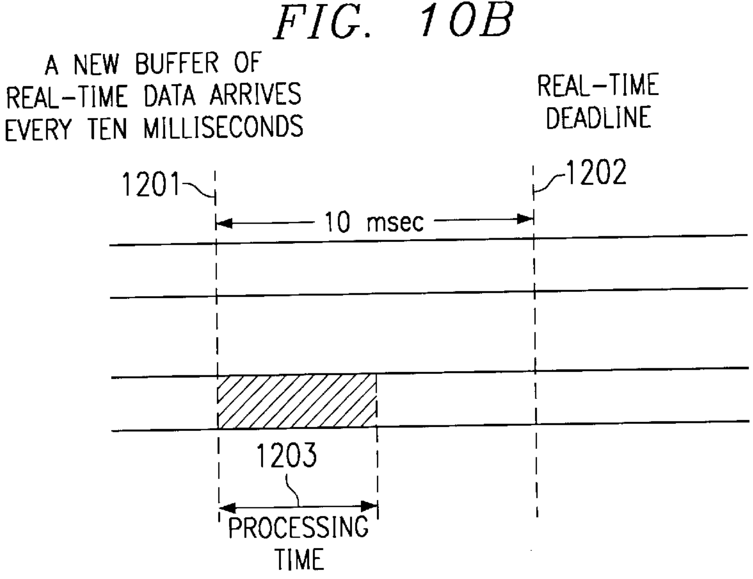
Figure 10C:
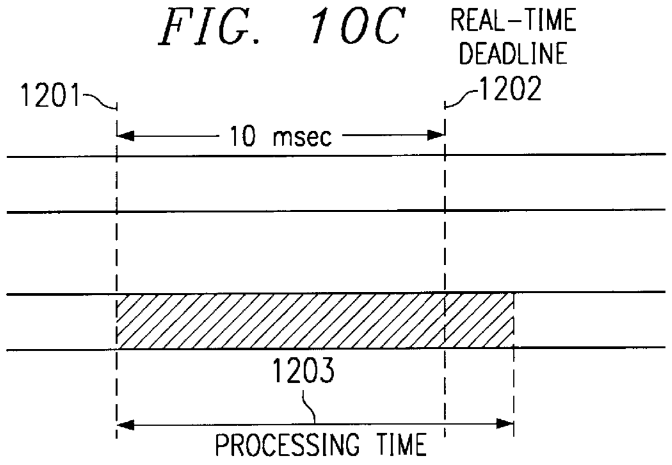

FIG. 10A provides an illustration of a very simple real-time processing scenario. Data from some real-time process (like the audio signal inside a television set) is suitably "fed" to two input data buffers 1101 and 1102. In this example, each data buffer is comprised of sufficient memory to store 64 data samples. Normally after buffer 1101 is filled with real-time data, processor 1103 commences the execution of a desired processing algorithm (e.g. filtering out noise). Following the processing of the data in buffer 1101, the resulting data is forwarded to output device 1104. While the data in buffer 1101 is being processed, the input data stream is "fed" to buffer 1102. After buffer 1102 is filled with real-time data, processor 1103 will commence processing of the data in that buffer. Processing continues in alternating fashion with each buffer being replenished with new data samples while the data in the other buffer is processed. Successful processing is predicated, as shown in FIG. 10B, on the fact that the processor is sufficiently fast such that it can complete the processing of a single buffer of data before the next data buffer is full. The term "real-time deadline" means that there exists a point in time where processing of one buffer must be completed so that processing of a new buffer can begin. FIG. 10B shows a case where the processing time concludes well before the real-time deadline. Alternatively, FIG. 10C shows a case where the processing time exceeds the real-time deadline. The result here would likely be manifest as some audible impairment.

Control information pertains to "asynchronous" control operations like changing a volume control setting. Control operations are not time critical, and hence real-time deadlines are not imposed. The graphical solutions development system has the ability to define and process these two distinctly different types of "information" in completely different ways.

In an embodiment, neither the component that creates the event, nor the component that will receive the event has to know how the "event information" is being transmitted. Indeed, both the framework and the components have the capability to adapt and automatically implement compatible encoding/decoding protocols. To accomplish this, code must be added to the project. This code may be generated by the framework or by the components. The software that does the encoding is called a proxy. The code that does the decoding is called a stub.

In prior art, event wires have been used to illustrate the routing of event information. In contrast, in an embodiment of the present invention, the method used to implement the communication channel does not have to be defined or standardized when the components are created; rather, they can be defined when the components are "assembled" into a solution. So our event wires do not represent a fixed event mechanism; they are more like chameleons.

FIG. 8B illustrated the control flow scenario in a drawing. Source block 804 is the block that generates an output event. Source pin 824 is an output event pin on source block 804 that generates the output event. Destination block 802 is the block that receives the input event. Destination pin 822 is the input event pin on destination block 822 receiving the input event. Control wire 805 is the channel on which the control information flows from an output event pin to an input event pin. Proxy code is generated for the source pin to map the control information from the source code block to the wire and/or destination pin on the destination block. Stub code is generated for the destination pin to map the control information from the source pin and/or wire to the destination pin on the destination block.

In FIG. 8B, volume control component 804 generates output events whenever slider thumb 808 is moved. Event wire 805 represents a communication channel (or protocol) that delivers the output events from volume control component 804 to gain control component 802. The stub code and the proxy code are not usually supplied by components, but rather are provided by a framework. (The callouts in FIG. 8B make it look like the proxy and stub are either part of a pin or part of a component. They could be inside of the component or they may not be. They are usually associated with the respective pins, so this is more of a conceptual convenience.)

Figure 25A:
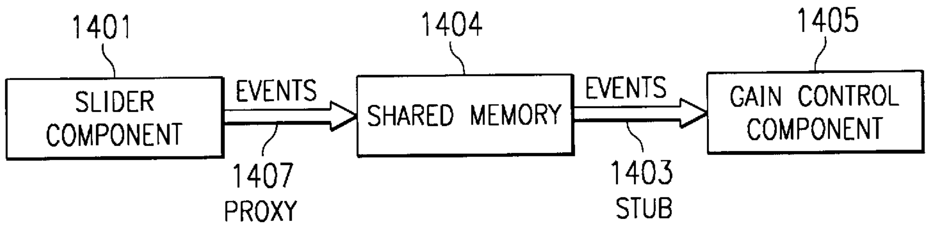

FIG. 25A provides a simple illustration where volume control "slider component" 1401 sends events to gain control component 1405 via shared memory 1404. For this protocol, slider component 1401 can send output events by calling the (proxy) ControlObjectX function shown in FIG. 25B. In this case, events are represented as integers. Input events are received by calls to the (stub) stubControlObjectX function given in FIG. 25C.

FIG. 25D implements a completely different physical connection to pass events from volume control slider component 1401 to gain control component 1405. In this case, the events are sent from personal computer 1404 to telephony device 1408 via universal serial bus (USB) connection 1406.

The code for the proxy and the stub that send and receive events using USB connection 1406 are given in FIGS. 25E and 25F, respectively. Note that, just as in the previous description, the proxy is provided by a call to the ControlObjectX function, and the stub is provided by calls to the stubControlObject function. Note that the proxy and stub have the same calling conventions (same function names and same parameters are passed). Slider component 1401 and gain component 1405 have no control over how the events are being passed.

This example can be expanded to cover a wide variety of situations that include different physical locations, different electrical (or other) connections, different protocols, etc. The source and destination blocks can be located anywhere in a drawing; in fact, the source and/or destination block(s) could be external to the drawing, such as applications not represented in the drawing. Examples include, but are not limited to: source and destination blocks can be executing in the same task, or different tasks; source and destination blocks can be executing in the same process, or different processes; source and destination blocks can be executing on the same processor, or different processors; and, source and destination blocks can be executing on the same platform, or different platforms A proxy is the interface between an output event pin and a wire. A stub is an interface between a wire and an input event pin. The source and destination pins define the format of the information at the pin or the interface between the block and the wire. The definition of the interfaces can take on any form that can be described by an interface definition file. Interface examples include, but are not limited to:

global variable, C function call, collection of C function calls, C++ function call, collection of C++ function calls, COM interface, assembly calling convention, and data page pointer calling convention.

In the GSDS, the interface definition may be defined by a block when it is instantiated, or it may be left undefined, relying on the framework to assign an optimum interface implementation. Examples include, but are not limited to, the following:

source block output event pin defines output event interface; source block output event pin adapts output event interface; destination block input event pin defines input event interface; and, destination block input event pin adapts input event interface. Some usual combinations are: source block defined output event interface is tied to a destination block adapting input event interface. In this case the stub code automatically adapts to the proxy code; source block defined output event interface is tied to a destination block defined input event interface (In this case a suitable translation (or mapping) is generated either in the proxy or the stub or both to match the information definitions); source block adapted output event interface tied to a destination block adapting input event interface (Here the framework specified the optimum mapping. The proxy and stub default to the best-obtained solution); and, source block adapted output event tied to a destination block define input even—the proxy code adapts to the stub code.

The proxy and stub code may also be a function of the properties of the wire interconnecting them. The wire represents a channel of control information flow. The properties of this channel (i.e. wire) are a function of many items including, but not limited to, the following: relative physical locations of the source block and the control block, platform characteristics, processor characteristics, RTOS currently loaded, communication mechanism (parallel port, shared memory, etc.), and operating system support.

Although there are thousands of possible event passing mechanisms (or channels) the code inside a block is always the same. The application code in each block simply makes that same API call no matter what event-passing scheme is in effect. The entire proxy/stub mechanism can be later refined without any changes to the application code. This makes it possible to create components that remain versatile and compatible in the face of many possible event-passing conventions.

A block may define any number of control interfaces by defining source (output events) and destination (input events) pins. Each pin can have a different format for the control information.

Several different types of components can be used in a drawing. The most obvious components are software components. Software components are components that ultimately produce instructions for one or more processors. Typical components include software that is designed to perform a pre-defined task (e.g. a sine wave signal source). Other types of components include hardware components, platform components, framework components, annotation components, and intrinsic components.

Platform components are components that contain information about the target hardware where the project's executable code will be "run".

In some cases, the operating system or kernel may be represented via a component. In this instance the operating system component can have user-accessible properties; it may or may not expose any pins.

Hardware components may also be used to represent hardware rather than software functions, for example a digital-to-analog converter, or a data-access-arrangement (DAA) for a modem. While these hardware components are implemented using electronic hardware (e.g. resistors, capacitors, integrated circuits, transformers, etc.) rather than being implemented in software, they usually require software to appropriately configure them for proper operation in accordance with their property settings. A codec, for example, may need a special software driver to configure sample rates, anti-aliasing filters, channel selection, data format, etc.

Figure 11:
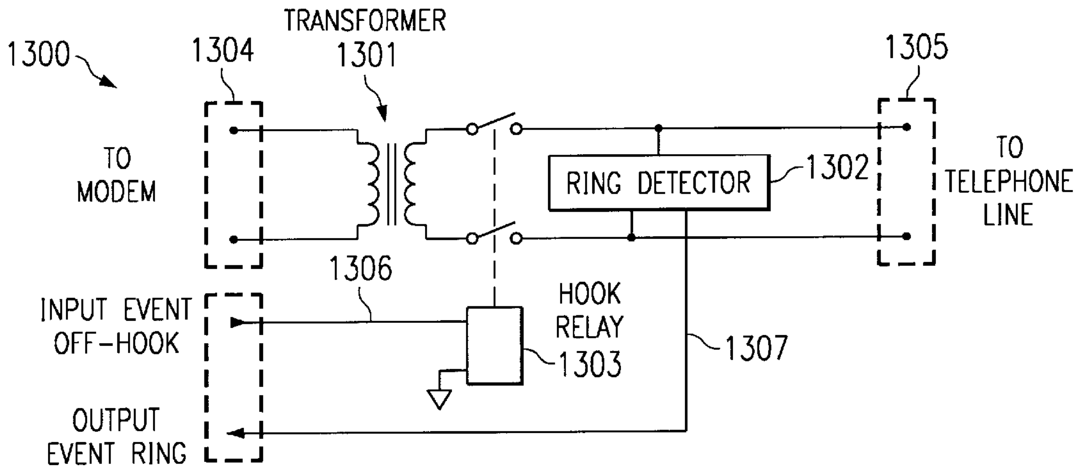
FIG. 11 is a hardware component.

FIG. 11 provides an example of a hardware component: the telephone-line interface 1300 (commonly referred to as a DAA, an abbreviation for "direct access arrangement"). This interface is truly a hardware component because it comprises several hardware devices like transformer 1301, ring-detector 1302, and relay 1303. The DAA accepts one input event 1306 that is a command to put the telephone line into the "Offhook" state (equivalent to picking up the handset on a common telephone device). The DAA also produces one output event 1307. Output event 1307 is generated each time the central telephone office sends a RING signal. A DAA 1300 is commonly used as an interface between the telephone line and the circuitry of the modem. In such an application, the modem software is responsible for generating appropriate output events to the DAA, and for processing incoming events from the DAA. The ability to represent a hardware component in a GSDS drawing provides a powerful improvement.

Figure 12:
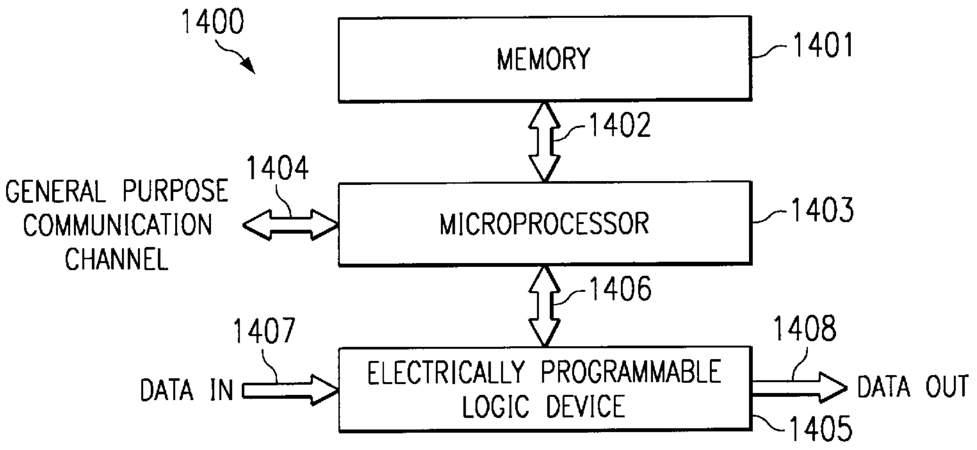
FIG. 12 illustrates programmable logic component.

Some hardware components may represent programmable logic that can implement suitable algorithms, state machines, etc. The GSDS may provide software optimization modules that help optimize the partitioning of processing tasks between hardware (executed via hardware logic) and software (executed on a microprocessor). FIG. 12 gives an example of how a programmable logic device 1405 (PLD) can be used to implement a data-processing component. This component would be represented in a drawing as a simple block having two data pins: Data In 1407 and Data Out 1408. In operation programmable logic device 1405 would be programmed (whenever required) via interface 1406 to microprocessor 1403. Processor 1403 might access desired algorithms or programming instructions from either its resident memory devices 1401 or from an external source via general-purpose communication channel 1404.

Framework components are components that supply rules and/or rule-checking engines that support verification of proper component usage which may include wiring, Component property settings, data formats, event-passing protocols, etc.

Figure 13:
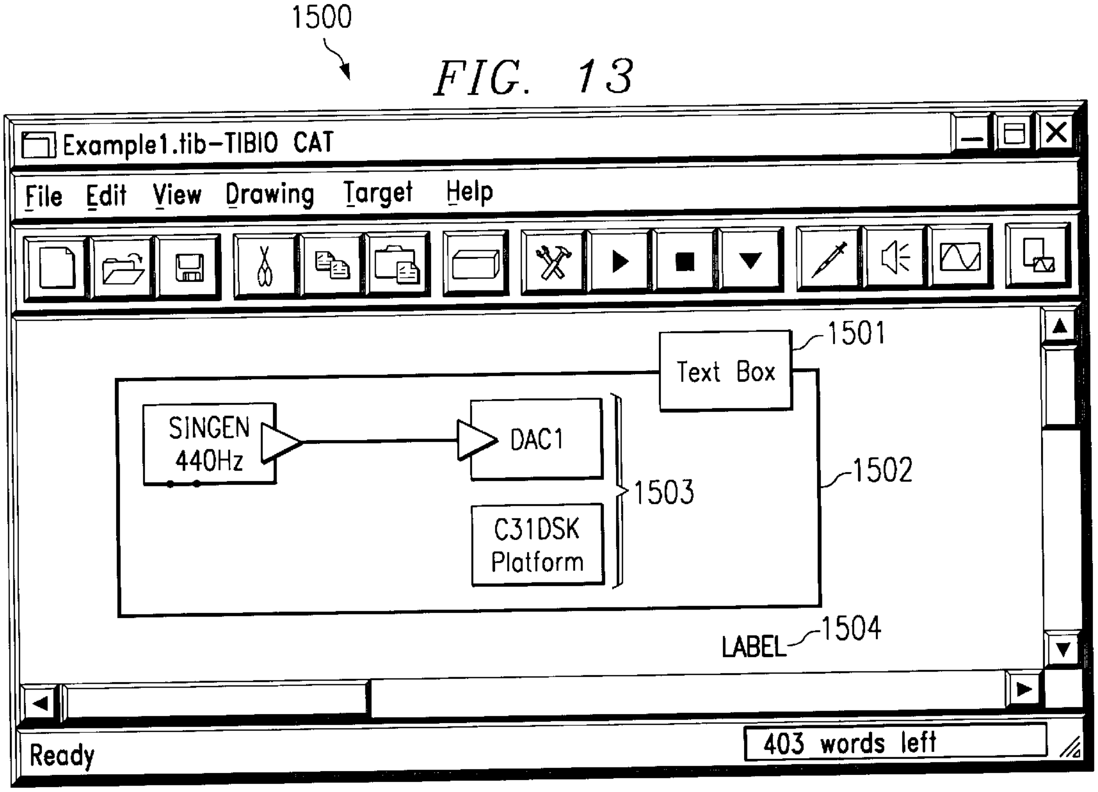
FIG. 13 shows annotation component.

For clarity, a drawing on the main computer display may need to be annotated with textboxes, dotted lines, labels, etc. These are all visual annotation components that contribute no software code. However a dotted box around a group of components may represent a specific group property (e.g. a specific task with properties like priority). In this instance, although the dotted box does not directly add any code to the project, it may denote a certain condition that requires code for satisfaction. FIG. 13 provides a simple drawing featuring several annotation components. Text box 1501 enables the user to add explanatory text to a drawing. Text boxes are resizable, and both the fill color and the line color can be user selected. Rectangle 1502 can be used to denote items in the drawing that have some common characteristic. Lines 1503 can be used to create line drawings. Text labels 1504 can also be added to provide clarity. These are just a few of the possible annotation components; others include circles, block arrows, callouts, dotted lines, and bitmapped icons. Because annotation components represent the special case of being totally passive in every way, they do not have to be stored in the same file format as other components. Also they may be accessed from a convenient tool bar rather than from the component gallery.

Intrinsic components are those components that are available from the graphical solutions development system. These are only available while the GSDS is running. These are very handy for debugging purposes. Intrinsic components always run on system 100 of FIG. 1. They do no belong to a project and they do not contribute code to a project.

User-defined components are representatives of another type of component. These are "component shells" that have little or no inherent code. User-defined components provide editing capabilities (like text editing) so that software code (e.g. C source code) can be entered directly by the user, pins can be added, and properties can be defined. These components are similar in every way to other components, but they permit a user to completely define their functionality (via user-entered code rather than graphical components). After the user finishes writing and debugging the code in a user-defined component, the user-defined component will be graphically represented in a drawing as a block similar to any other block.

Figure 14A:
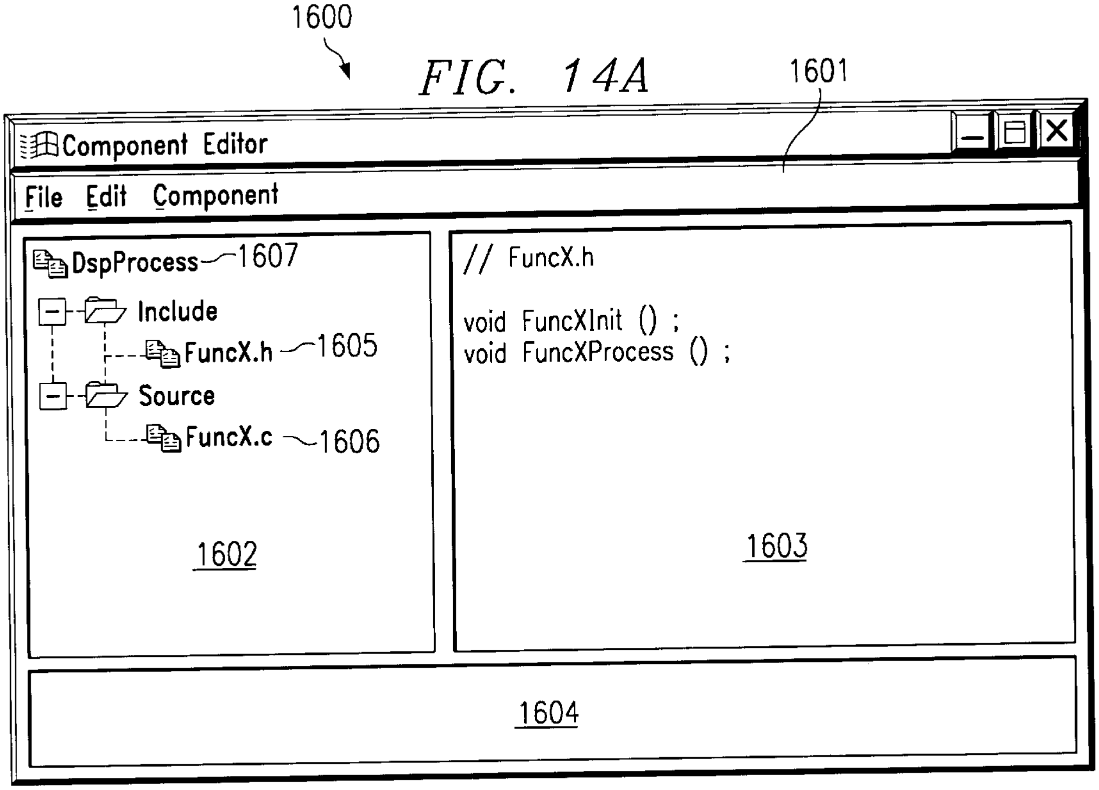
FIGS. 14A–14B show a user interface and block drawing.

One possible user interface 1600 for a user-defined component is given in FIG. 14A. User interface 1600 is comprised of menu bar 1601, tree view 1602 showing project folders, edit window 1603, and status window 1604. Because the user has configured this user-defined component to execute in the "DspProcess" project, tree view window 1602 is currently displaying the contents of "DspProcess" project folder 1607. Code files for this particular component instance are created in the appropriate project folders. The header file is created in "Include" folder 1605, and the C source file is created in "Source" folder 1606. As the full drawing is composed, by adding additional components, additional header and source code files will be copied into these same project folders.

Edit window 1603 provides a text-editing capability (including text entry) that permits the user to write any source code needed to implement the desired function. In some implementations user interface 1600 may employ an external editor of choice.

Status window 1604 displays helpful status information during compile and debugging operations.

Figure 14B:
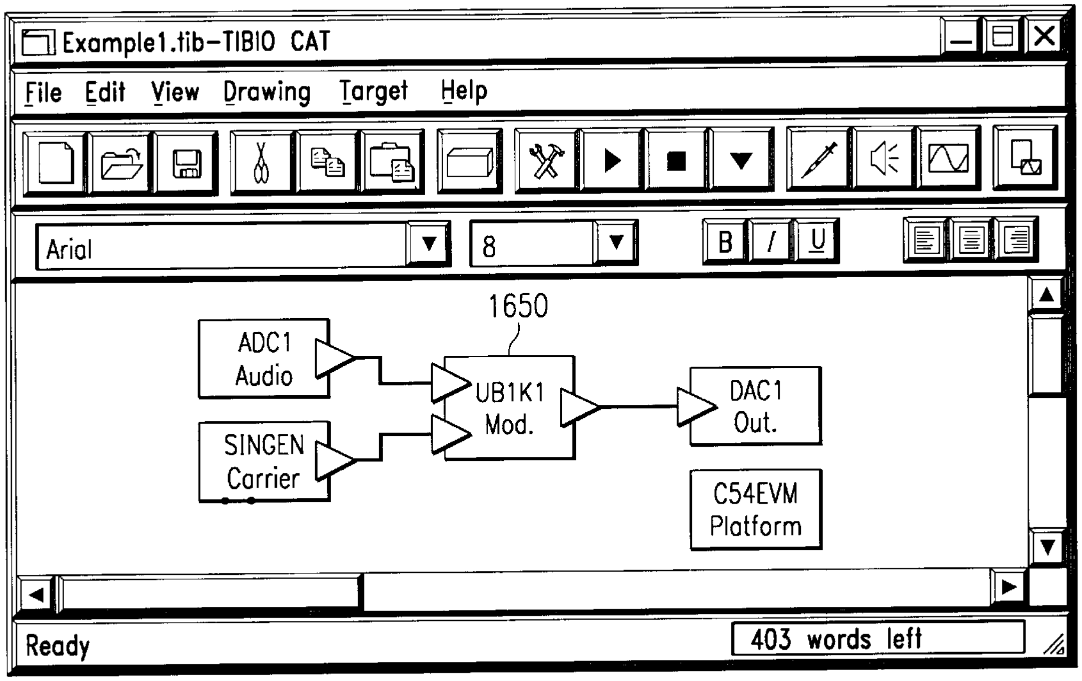

FIG. 14B shows a drawing of a simple "program" that includes user-defined component 1650. This block has an instance name of "Ublk1" and has been employed to realize a proprietary modulation algorithm.

Note that the user-defined code block may also be used to create use-defined algorithms for a programmable logic device, like the example in FIG. 12. In such a case, the "code" might be written in a different language, and also might be compiled with a special, "PLD" compiler.

Components may also be used to represent the combined functionality of an aggregate composed of both hardware and software. An example might be a modem component.

After the user creates a drawing, but before it runs for the first time, the user usually needs to configure the property settings for each component on the drawing. As seen in FIG. 8C, each component has a number of property settings that are provided to specifically define how the component should operate.

Figure 15:
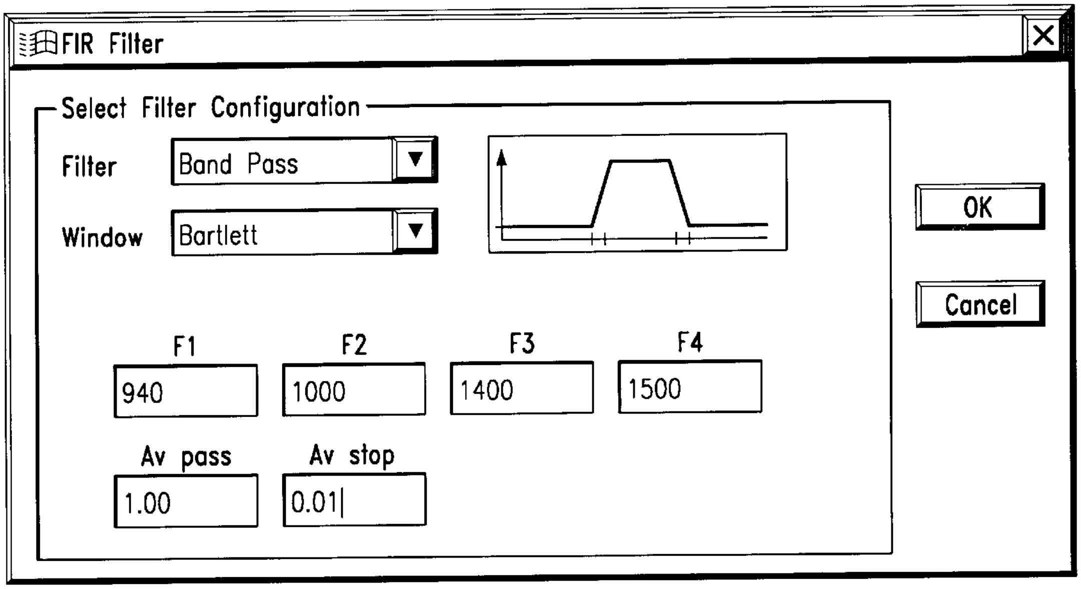
FIG. 15 illustrates a property dialog window.

User access to property settings may be presented to the user in several different ways including list-boxes (very similar to FIG. 8C), icon-based graphical user interfaces, dedicated property dialog windows, and via "wizards" that prompt the user for performance-related information and then process the user inputs to determine actual property settings. A typical property dialog for a finite-impulse response filter (i.e. FIR filter) is given in FIG. 15. Note that this property dialog window is composed of drop-down lists, labels, edit boxes, and buttons. There is also a graphical icon to generically portray the filter characteristic. From the user-supplied information (entered in this window) several different activities can be completed automatically: 1) the number of filter sections can be computed, 2) the coefficients for the filter can be computed, 3) the appropriate code modules can be selected, 4) the code can be modified by insertion of the proper coefficient values, etc. This example clearly exemplifies one of the major benefits of the graphical solutions development system and the use of intelligent components: The user is able to access optimized functionality of a FIR filter without having to 1) understand how a FIR filter works, 2) write any code, 3) determine the number of filter sections needed to achieve desired performance, or 4) calculate the necessary filter coefficients.

Figures 16A, 16B:
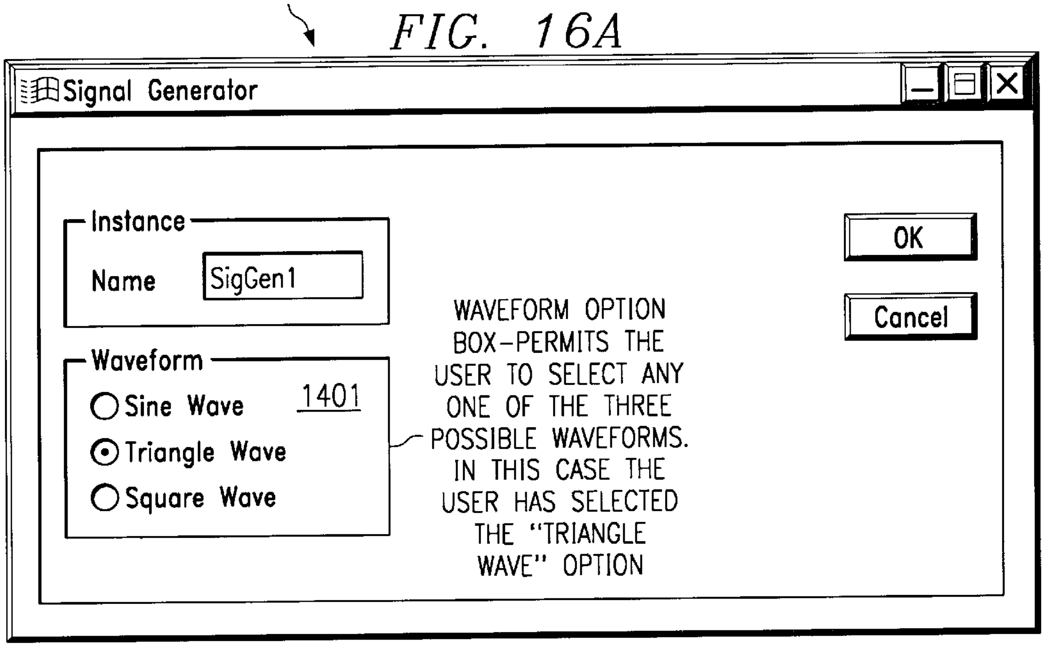

Component property values, set by the user, are frequently used to determine which software code modules should be contributed to a solutions project. FIGS. 16A, 16B, and 16C provide a simplified example of how a component may contribute different code modules to a solutions project depending on its property settings. As seen in FIG. 16A, a property dialog for a waveform-generator component may offer the user a property dialog where the user can select the desired output waveform. In this example the waveform option-box indicates that the user has selected the "Triangle" waveform. FIG. 16B gives a table showing some of the resources that are encapsulated in the waveform generator component. The person who created this component knew that if a user wished to achieve the "Triangle" waveform, that this component should copy the "triangle files" (triangle.h, triangle.c, and triangle.obj) into the project. To accomplish this the person who created the component would include an "OnProperty" script similar to the one shown in FIG. 16C. The OnProperty script permits the component creator to deliver a measure of his "integration knowledge", valuable insight about how the component can be integrated into a project to implement a useful solution.

The OnProperty script implements five essential functions: 1) whenever the OnProperty script runs, it generates the dialog window that is shown in FIG. 16A; 2) when the OnProperty dialog window closes, determine if it was closed with an "OK" (button click) result or with a "CANCEL" (button click) result; 3) if the dialog window was terminated via the OK button, then determine the user-selected waveform; 4) based on which waveform was selected, copy appropriate software modules to the project; 5) if the dialog was closed via the CANCEL button, then do nothing.

All of the logical flow of the OnProperty script represents "intelligence" that the component author embeds in the component when it is created. If two different experts decide to separately publish a component offering the same functionality, the expert who better understands how the component can be used and how the code may need to be modified (or "tweaked") for various operating situations will enjoy a competitive advantage.

Before any solutions project can be "built" (e.g. compiled, etc.) and "run" there are several activities that must be completed: 1) all necessary source-code modules must be deposited into appropriate file folders, 2) all necessary "include" files must be copied into appropriate file folders, 3) all header files must be copied to appropriate file folders, etc. In the case of a GSDS project there are additional complexities. First a "main" source file (e.g. main.c) must be generated. While the code modules for each component can be composed when the component is created, the "main" source file, which represents how the various components are interconnected, cannot be written (or generated) until a drawing has been completed. One of the main goals of the GSDS is to assist new users in accessing powerful technology that has heretofore been the private domain of a relatively small group of experts. For this reason, the GSDS implements a strategy that can "inspect" a drawing and automatically generate the appropriate "main" source file. The next few paragraphs explain how the GSDS extracts and processes information from a drawing to generate a complete project that matches the user's expectations.

The screen shot of FIG. 17A shows a functionally complete drawing as it appears in the GSDS environment. This drawing shows two instances of a sine-wave component 1701 and 1702. These blocks have instance names "SIN1" and "SIN2" respectively. The outputs of the two sine-wave blocks are connected to arithmetic-logic unit (ALU) block 1703. The instance name (or block name) of this block is "ALU1". The ALU block generates an output signal that is mathematically computed from the two input signals based on an "operation" property that is set by the user. The operation property is confined to one of four possible math operations: add, subtract, multiply, or divide. In this particular drawing, ALU block 1703 is configured for addition, and a label is provided to indicate which operation is currently selected. Here the label shows a plus sign (+) to indicate addition. The output signal from ALU 1703 is connected to digital-to-analog converter (DAC) block 1704. Slider control 1705 is connected to the "Frequency-Input-Event" pin on sine-wave generator 1702. (Note: To avoid clutter, there are no labels on any of the pins. However, anytime that the screen cursor is positioned near a pin on any block, a label (often referred to as a "tool-tip") appears to provide the pin-name and data type.) When this drawing is "run", slider control 1705 permits the user to vary the frequency of sine-wave generator 1702. Platform block 1706 is labeled "C3×DSK". Platform block 1706 provides information about the actual hardware, which in this case is a Texas Instruments TMS320C3×DSP Starter Kit.

Figure 17B:
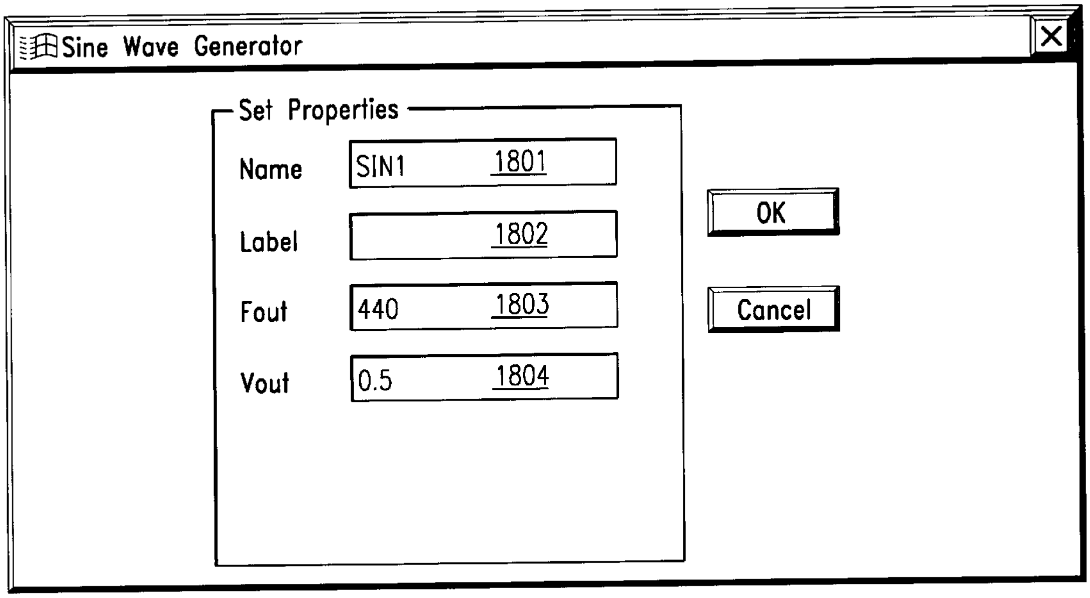

After constructing this drawing, the user has an opportunity to set the properties of each block on the drawing. User access to property settings is via a property dialog window. There are several ways to invoke a block's dialog window, including "double-clicking" on a block with the pointing device. The property dialog window for the sine-wave block is shown in FIG. 17B. Name field 1801 is an edit box where the user can enter the desired instance name. In any given project, all instance names must be unique. If two or more blocks are given the same name, then the framework will detect a name "clash" and warn the user. The GSDS provides a user selectable feature referred to as "auto-naming" that will automatically generate unique names as each block is added to a drawing. The user has the option to over-ride the automatically assigned name. Label field 1802 is an optional property that will add a text label to a component. (In ALU block 1703, the label field is used to exhibit the arithmetic operator.) Fout field 1803 sets the default sine-wave frequency. At runtime, the sine-wave block will generate sinusoidal data at the default frequency until it receives a frequency-change event at the "Frequency-Input-Event" pin. Vout field 1804 sets the default value of the peak amplitude of the computed sinusoidal data. Because drawing 1700 uses two sine-wave generators, the values for each on these blocks must be set individually.

Figure 17C:
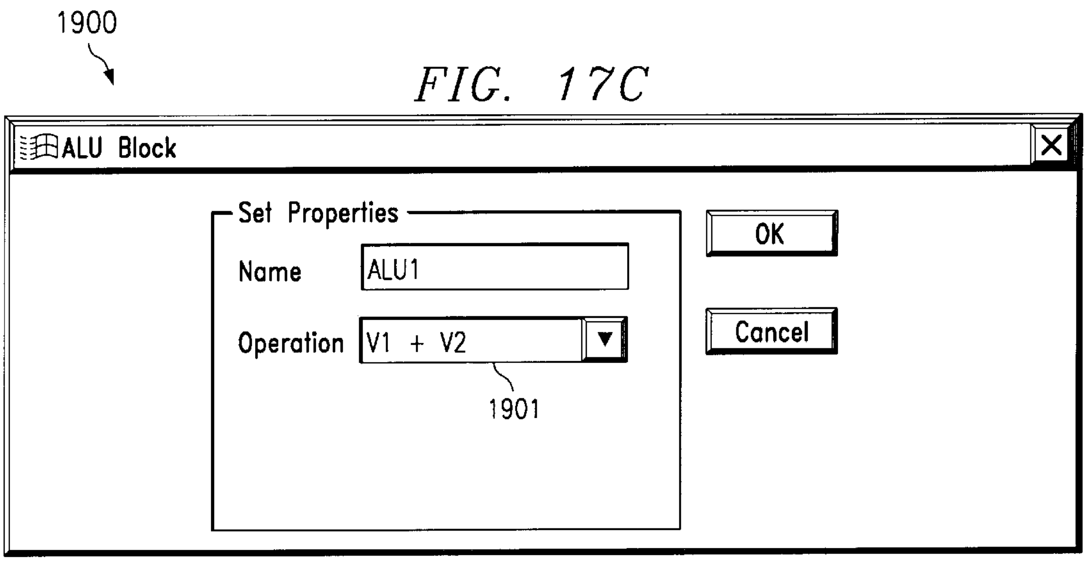

The property dialog window for the ALU block is given in FIG. 17C. Here the desired "Operation" is user-selectable via "drop-down" list control 1901.

Figure 17D:
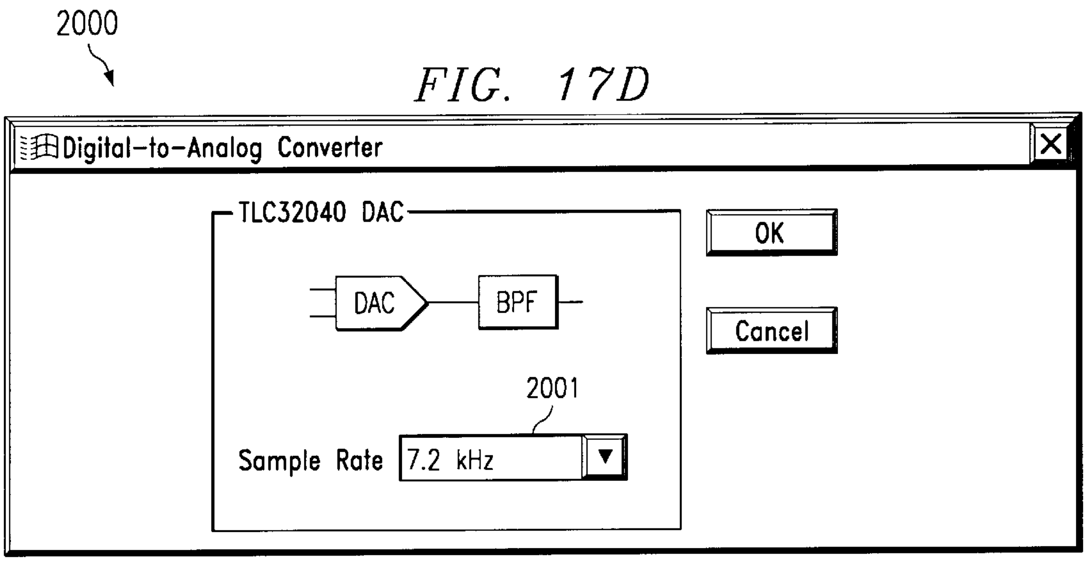

Similarly, a property dialog window for the digital-to-analog converter is provided as shown in FIG. 17D. For this particular DAC implementation, the data-sampling rate is user selectable from this dialog window via drop-down list control 2001. In many cases, the data-sampling rate will be defined using alternate methods.

Figure 17E:
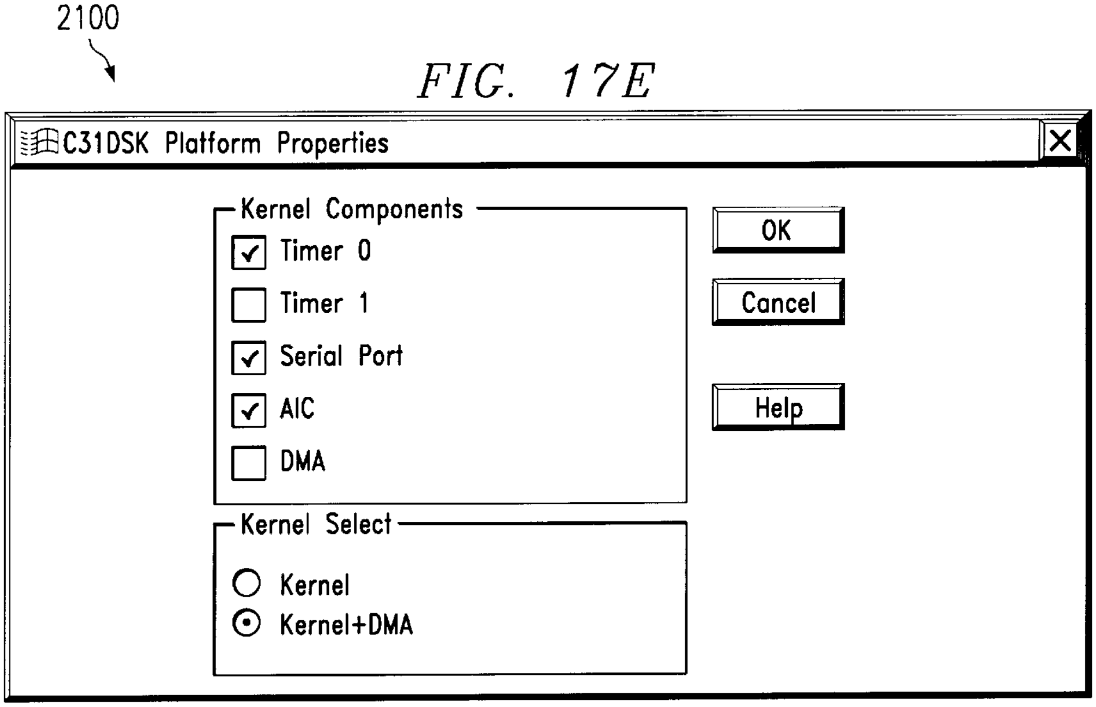

Platform block 1706 provides the property dialog window shown in FIG. 17E. This particular platform includes a modular kernel, where individual kernel-modules are user selected as shown in the figure. The ability to custom tailor the operating kernel permits the user to minimize memory usage.

Figure 17F:
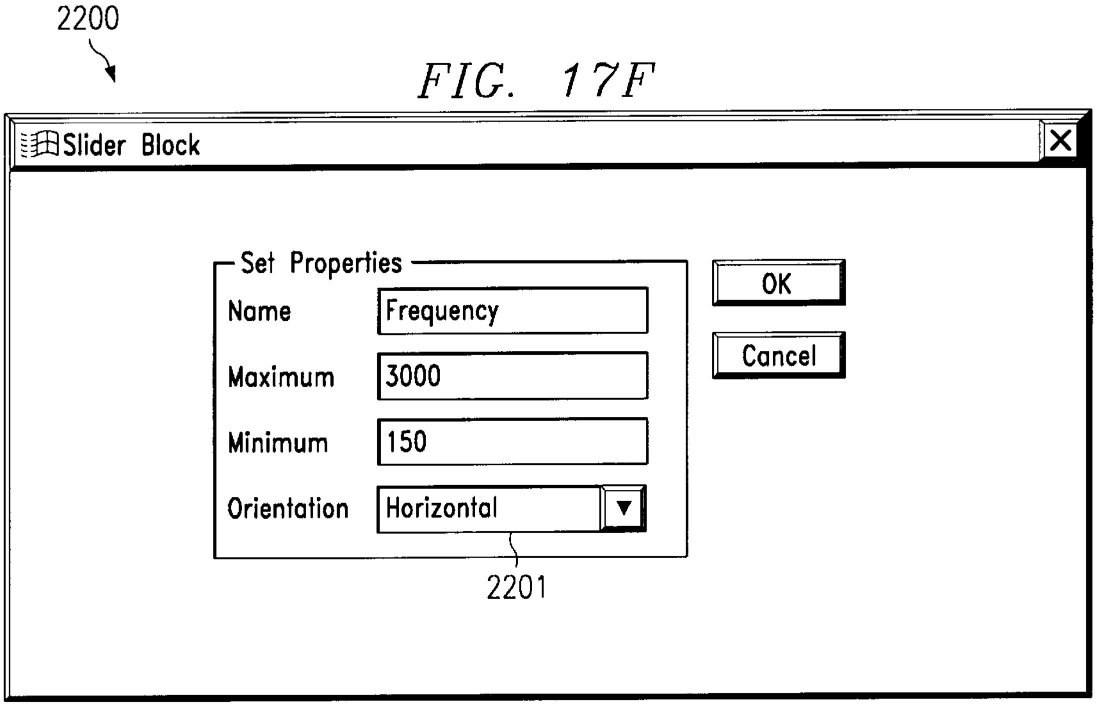

The property dialog window shown in FIG. 17F is for slider control 1705. Movement of the slider thumb from one extreme to the other (i.e. far left to far right) will produce events with values varying from a minimum of 150 to a maximum of 3000. The actual event values that are generated will be directly proportional to the position of the thumb. The slider control only generates output events when the slider thumb is moved. Orientation field 2201 configures the visual orientation of the slider block icon on the display screen. The only two options are horizontal and vertical.

Inside of each component there are many files and/or resources. Among these resources are script files that are used by the GSDS to permit each component to react to the GSDS and its environment in its own unique way. In the example drawing 1700, most of the components include three different scripts: OnProperty, OnDeposit, and OnAssemble. Each of these scripts is executed by the GSDS at different times in the design process. The OnProperty script is executed whenever the user requests the property dialog window. Whenever the "build" process is initiated, two activities must be accomplished. First, the wire interconnections must be analyzed to determine how the data should pass from one block to the next, and how events should be passed from one block to the next. Second, the source code for the "main" module must be generated. During the next phase of the build process, the block list is again traversed and the OnDeposit scripts for each block are executed. OnDeposit scripts are employed to copy files and resources from inside the block to the appropriate project folders.

All of the information shown on the drawing 1700 is maintained by the GSDS in a comprehensive drawing object array. The script language, which is similar to Microsoft's Visual Basic for Applications (VBA), has been extended with a powerful set of APIs (application-programmer interfaces) that permit scripts to both query and modify objects in the drawing object array. The APIs comprise a set of basic functions that can count the number of elements in a collection, can obtain object names based or pointers (and vice versa), can read or modify property settings, and other similar functions. These APIs in component-borne scripts provide programming power.

The OnProperty script for the sine-wave component is given in FIG. 17G. This script had three sections that are of note. Section 2301 is the code that defines exactly what the dialog window will look like. This specifies the size and layout of the dialog window, all labels, all edit-boxes, and all pictures and buttons.

Section 2302 retrieves the previously set property values for the block and updates the dialog controls in the property dialog window. The first time that the property dialog window is presented, the user will have had no opportunity to make any property modifications. In this case, this section of code detects that no properties have been set, and default values for all properties are automatically generated.

Section 2303 determines what happens when the dialog window is dismissed. If it is closed via the "OK" button, then the block properties, which are maintained by the GSDS, are updated with the values that have been entered in the property window. If the property window is closed via the "Cancel" button, then the script makes no changes to the block's current property values.

Every block in the drawing 1700 has a similar OnProperty script.

The OnAssemble script 2500 for the sine-wave generator is shown in FIG. 171. Code section 2501 is retrieving pointers to the current block, current project, and current workspace. Code section 2502 traverses the object array to determine the name of the wire attached to the sine-wave generator's output pin. The wire name is used as a parameter in the "main" code file. Code section 2503 queries to get the default property values for both signal frequency and signal amplitude. These will be used to initialize variables in the "main" source file. Code section 2504 determines the pin names for the event pins and concatenates the pin names with the block name to generate unique variable names. Code section 2505 builds declaration strings that will be pasted into the declaration section of the "main" source file. Similarly, code section 2506 builds strings that, when pasted into the "main" source file will be the actual function calls to the two functions that, by framework convention, every component must export. These are an INIT function to perform initialization, and a PROCESS function that is called at the sampling rate. The PROCESS function provides all mathematical or logical operations that the block is to apply to each data sample.

A similar sequence of OnAssemble operations is repeated for each block in a project. This represents a rather diverse data gathering operation. It would be very time consuming and inefficient to iterate through all the blocks to get the include-file information, then iterate through all of them again to get the wire variable names, then iterate again for block declarations, etc. A further difficulty would occur when a component is instantiated more than once in a drawing (like two sine-wave generators in drawing 1700). This would produce duplicate include statements, multiple copies of resources, as well as duplicate object code. The GSDS employs a novel concept called a fragment map. A fragment map is a temporary collection of data fragments. Each data fragment can be a line of code that needs to be included in the "main" source file. Fragments are organized into appropriate groups such as "Include", "Init", "Declare", etc. The entire fragment map can be generated in a single traversal of the block list. After the fragment map is generated, it is a rather simple matter to copy the fragments into the "main" source file in the proper order. Duplicates are easily filtered out during this main-file synthesis operation. Code section 2507 is an example of several code fragments being added to the fragment map.

Again, nearly every block will have a similar OnAssemble script.

FIG. 17H provides the OnDeposit script 2400 for the sine-wave generator. Code section 2401 queries to get pointers to the current block, the current project, and the current workspace. Code section 2402 illustrates how resources within the block are copied into appropriate project folders.

After all of the scripts have been run and the fragment map is completed, the GSDS copies and filters the fragments into the main source file. FIG. 17J provides a listing of the main source file 2600. In this instance, the main source file is named "DspMain.c". With the exception of the comments, this file was completely synthesized automatically by the GSDS. Subsequent GSDS operations would include compiling and linking.

The development system features a component gallery that provides a list of all components that are available to the user. These components may reside on system 100, or they may reside on remote systems (accessed via a local-area network or the Internet). The component gallery may present a combined listing of both local and remote components. The component gallery offers "filtering" options so that only components with certain features are presented in the gallery. (For example, only show components that are compatible with the Texas Instruments TMS320C5410 digital signal processor.) Filtering is a convenience that reduce productivity. FIG. 18 presents one possible rendering of a component gallery. Note that the component gallery could be represented using a set of icons rather than a list of text entries. The GSDS component gallery can automatically adapt to the drawing. One example is that once a platform component is added to a drawing, the component gallery can automatically filter the available components, and then show only the components that are compatible with the particular hardware on which they will be executed. The user can configure component gallery options to determine which filtering operations are desired.

Digital signal processing algorithms and digital signal processors are very complex. There is a limited cadre of experts who are able to produce effective digital signal processing solutions in a timely manner. The "journey" that a novice programmer must endure to reach even a minimum level of achievement and satisfaction is long, slow, and tedious. The graphical solutions development system attempts to minimize the difficulty that a digital signal-processing neophyte experiences. The ideal, but impractical, solution would be to have a digital signal processing expert sitting right beside the user to warn and explain things at each stumbling point. The development system provides an alternative, referred to here as a framework. In practical terms, the concept of a framework is actually better than a resident expert in many ways. It is not subject to human error, it is tireless, and it is not intimidating. The framework is comprised of a set of rules and a rule engine that is implemented in software in the graphical solutions development system application. The framework rules are composed by a team of experts who understand the many subtle issues, the tradeoffs, and the quirks involved in implementing digital signal processing solutions. Each time that the user changes anything on the screen (e.g. adds a component, moves a wire, changes a property) the rule engine executes the appropriate rules and provides user feedback. A simple example of a rule violation is where a wire is drawn from a pin that sends out 16-bit data to a pin that expects 8-bit data coming in. Depending on user preferences, main computer system speed, and other factors, the rule engine may be programmed to run after every drawing change, or only after specific events.

The data that comprise the rules and the rule engine of a framework may be physically distinct, or they may be "hard-coded" into an integrated implementation. A hard-coded implementation makes it more difficult to change rules, but this disadvantage is offset by enhanced execution speed.

A complete framework example is provided in FIG. 19D. This framework script code sequentially calls subroutines that verify rules for the workspace, the project, the blocks, and the wires. This simple example is somewhat deceptive. If a more robust framework were invoked to "examine" a non-trivial drawing, the verification process might involve hundreds or thousands of rule-checks. Without the advantage of an automatic rule-checker, it might take an expert programmer hours or days to locate just one rule violation. Thus the framework provides a very potent capability.

Even though a framework may be implemented using "hard-coded" routines, the framework may be partitioned into separate sets of rules. Each set of rules may focus on rules that pertain to one aspect of a drawing, for example: blocks. Further, it is possible that the code that checks a given set of rules be collected into separate framework modules. This leads to the concept of a framework "executive" routine that can call individual framework modules as needed. Framework modules can be arranged in a hierarchy. Various modules in the hierarchy may be replaced depending on specific drawing conditions. Consider a drawing where one portion of the drawing pertains to motor control, and another section of the same drawing pertains to speech recognition. (These differences in focus are sometimes referred to as different "problem domains".) In this example it is quite likely that the set of rules for wires in the motor control area will be different from the set of wire rules that apply to the speech recognition "circuitry". A framework executive is able to call the appropriate wiring-rule module depending on which section of the drawing is being analyzed.

Specialized (custom) versions of the GSDS may be designed with the framework "hard coded" into the GSDS code. In this case, the framework would be fixed and immutable. In other case, the framework may be a distinct module that can be replaced by the user. In yet another case, the framework may be implemented as components that appear in a drawing.

Figure 20A:
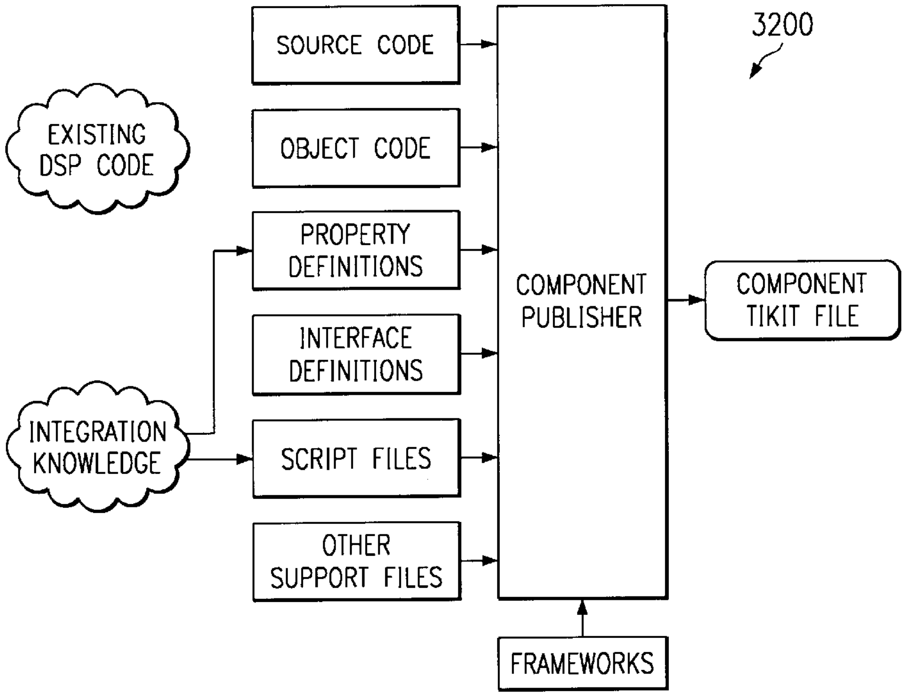
FIGS. 20A–20F show a development component publisher.
Figure 20B:
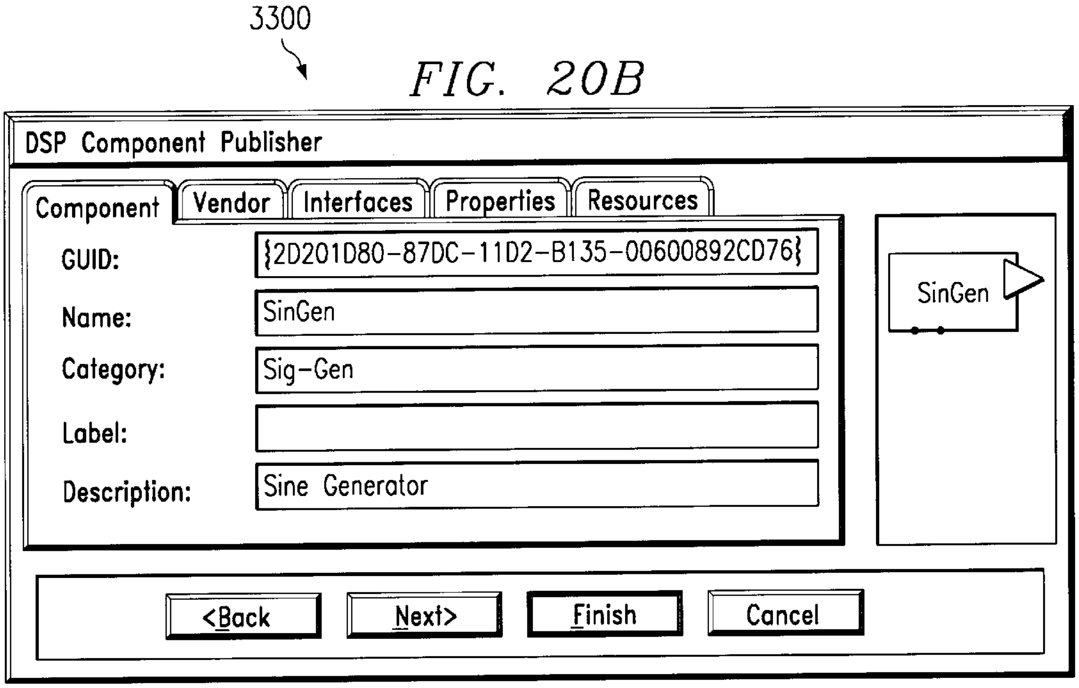

The graphical solutions development system 500 is based on the concept of the composition of several pre-engineered components to provide a higher-level solution. (This is analogous to bringing many mechanical components (engine, wheels, transmission, etc.) together to build an automobile.) The commercial success of the graphical solutions development system 500 is predicated on widespread availability of components. The graphical solutions development system provides a component publisher to facilitate the creation of components that are fully compatible with other components and the graphical solutions development system. FIG. 20A heuristically shows the overall structure.

The component publisher may be implemented using a sequential user dialog construction (this is frequently referred to as a wizard), or it may be implemented in other ways such as embedding "component publishing" capability directly into a user-defined component.

One example of a component publisher, employing a wizard construct, is shown in FIGS. 20B–20F. In this example, the wizard is configured as a tabbed dialog where the user can quickly and directly access the information on any tab. The first tab, FIG. 20B, requests the component author to fill in general information like the name, a description, etc. The "GUID" field is for a random number associated with this specific component. The term "GUID" is actually an abbreviation for Global Universal Identifier. (GUID technology is an established software standard.) In this case, the component publisher automatically generates the GUID which is a 128-bit identifier typically broken into five fields by hyphens and expressed in hexadecimal. The component publisher includes a symbol pane that provides a graphical view of the symbol that will appear in a GSDS drawing when an instance of this block is added. As the component is defined and refined, using subsequent tabs of the component publisher, this symbol will be automatically updated to represent the new component accurately.

The component publisher may include graphical editing capabilities that permit the user to directly modify the symbol. This might include changing size, changing colors, adding text fields, moving pin locations, etc. Buttons at the bottom of the component publisher permit the user to advance to the next tab, to retreat to previous tabs, or to cancel the publishing operation. The "Finish" button is enabled when all of the tabs are satisfactorily completed. The finish operation is chiefly concerned with formatting the data properly and storing it in a file.

Figure 20C:
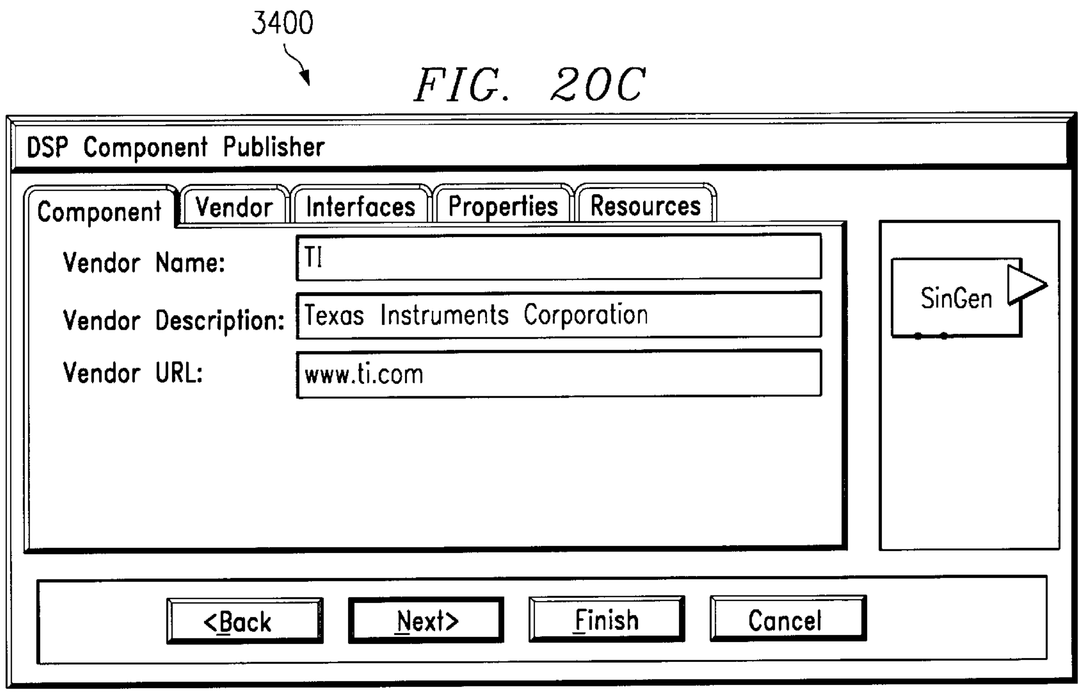

The vendor tab, FIG. 20C, collects pertinent vendor information. Other information could include addresses, technical support information, phone numbers, etc.

Figure 20D:
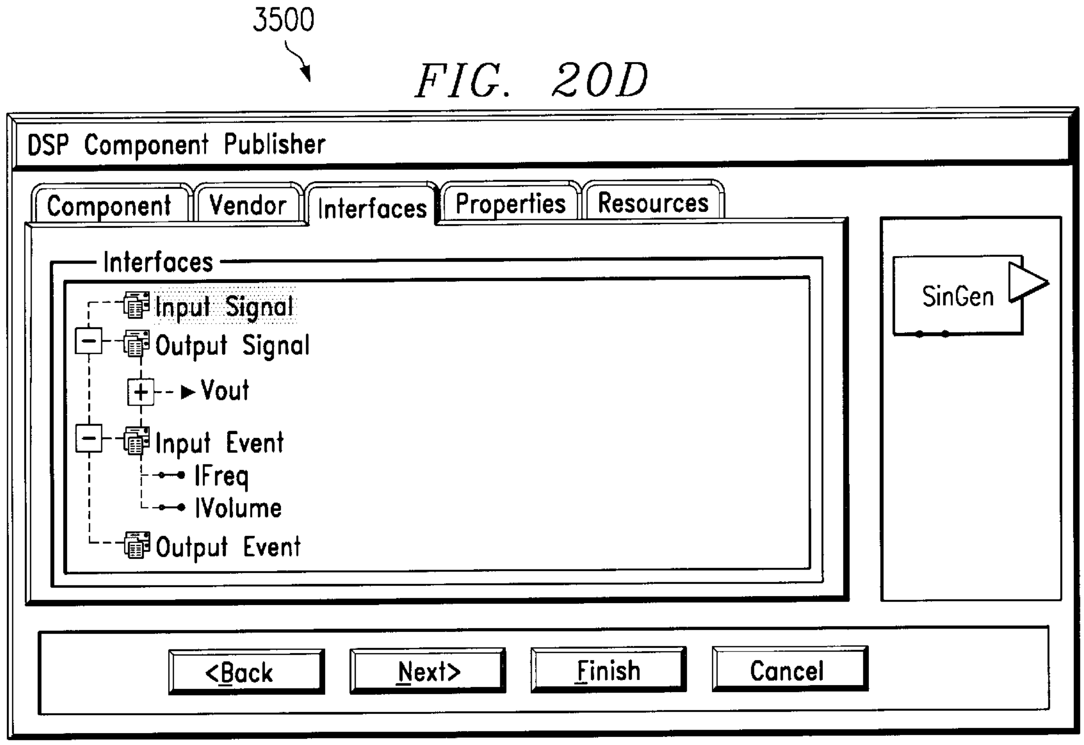

The interfaces tab, FIG. 20D, permits the component author to add pins to the component. For clarity, this tab provides a "tree view" of the pins. The component creator may add any number of pins into each of the four possible interface categories: Data Input, Data Output, Event Input, and Event Output. (The tree view shown in this example refers to the four pin categories using the labels "Input Signal", "Output Signal", "Input Event", and "Output Event" respectively. In FIG. 20D note that three pins have been defined: an Output Signal pin named "Vout" and two Input Event pins named "IFreq" and "IVolume".

Figure 20E:
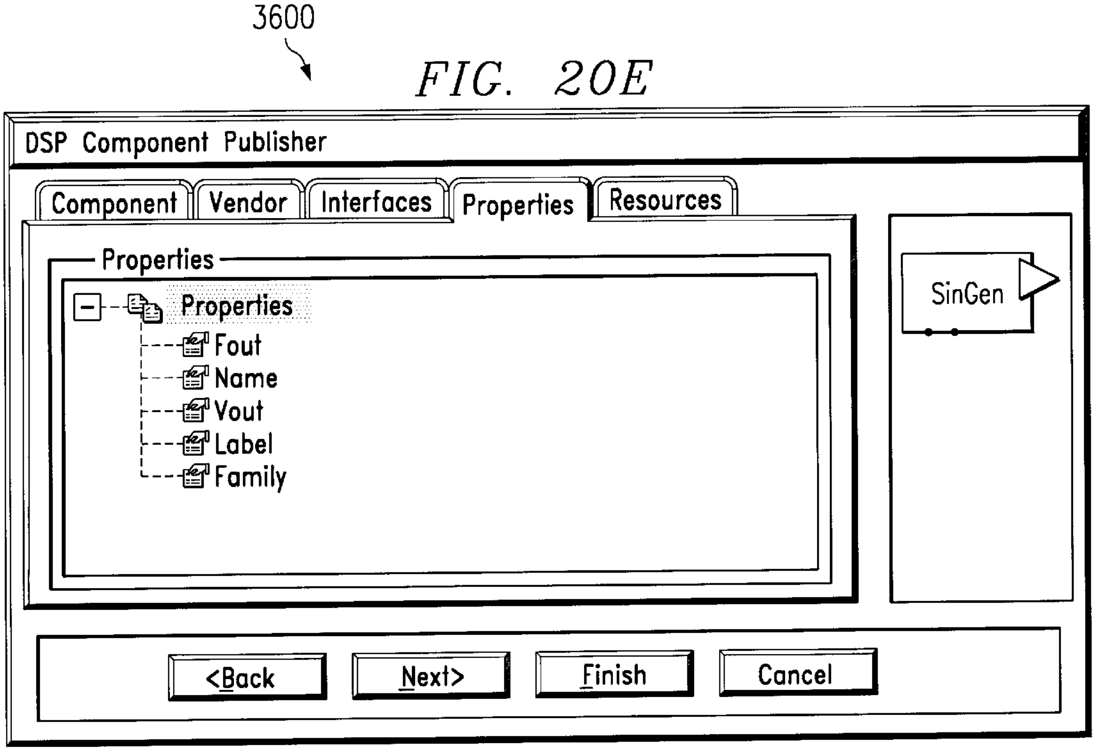

The properties tab, FIG. 20E, allows component properties to be added. Again a tree view is used to present the properties. Not shown, each property may have attributes. For example the signal frequency property, Fout, could have attributes "Fmax" and "Fmin" that could be used to limit the frequency range.

Figure 20F:
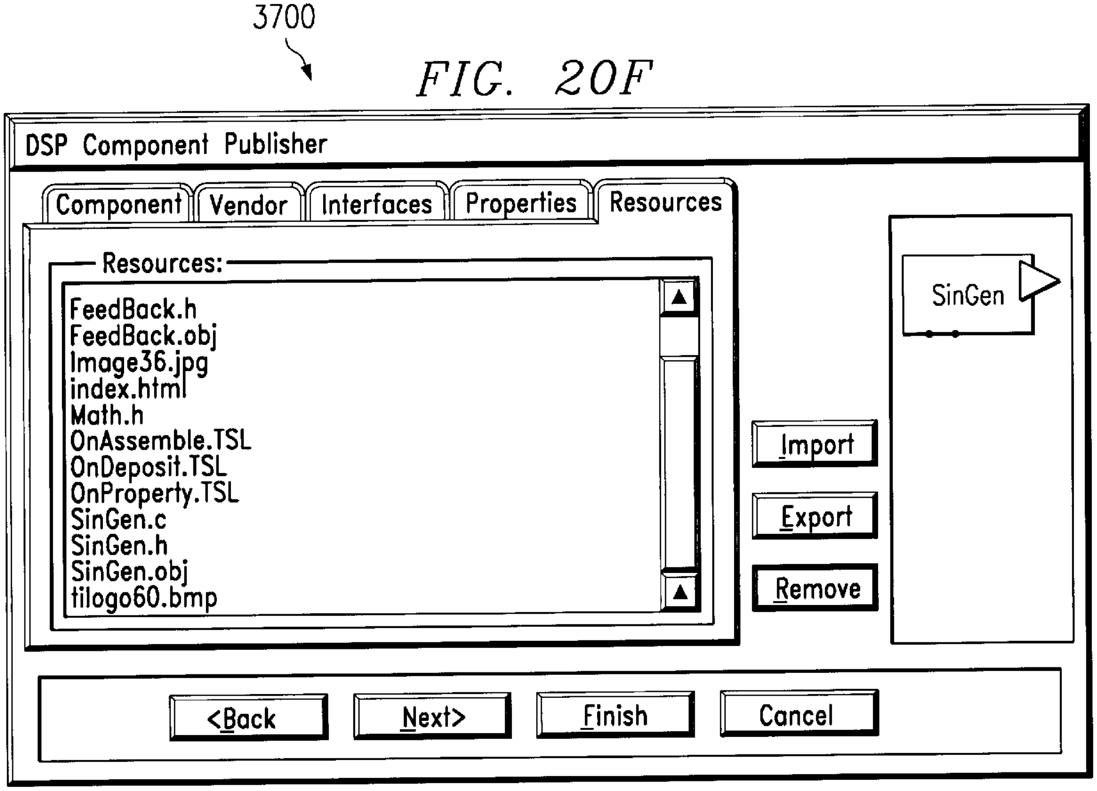

The resources tab, FIG. 20F is the dialog where the component author can insert any files that need to be added to the component. In this example, note that in addition to the source files that have been discussed, there is also a bitmap file (tilogo60.bmp) and three script files: OnAssemble.TSL, OnDeposit.TSL, and OnProperty.TSL.

The component author may use the component publisher to "edit" an existing component. In this case, the component publisher will "read" the component file and place all of the relevant information on the appropriate component publisher tabs. The author may then browse and edit the information as needed. Some components may have a "locking mechanism" that prevents normal users from modifying a component.

The component publisher verifies that all essential information is included before it will produce a finished component. One of the final steps in producing a component is to create a software file and storing all relevant component information in this file. The file may have a predefined, standardized format. The component publisher assures that component file, which is the physical collection of all the data in the component, is created and formatted in accordance with any applicable component standards.

The component publisher may use framework rules and/or the framework rule engine to assist in creation of a new or existing component. This verification process provides a great deal of assurance that a component will operate in a given framework. A component may be checked for compatibility with more than one framework.

An excerpt from a framework script is given in FIG. 21. This code is designed to verify that each pin on a component (or block) has a unique name. A pair of For/Next loops is used to iterate through all pins so that the name for each pin can be compared to the name of every other pin. Code sequence 3801 queries the GSDS to determine the number of component pins. Code sequence 3802 implements an outer loop that iterates all of the pins. For each pass of through the outer loop, the code of the inner loop 3803 iterates through all pins (that have not already been checked) and compares pin names to see if there are any duplicates. This example demonstrates that the expertise embedded in a framework script can be leveraged each time that a new component is created.

A typical drawing is a composition of components interconnected with wires. In such a drawing, data and control information are processed to achieve a desired result or solution. Frequently for debugging or for verification of proper operation, it is beneficial to be able to inspect the operation of a drawing at various points on the drawing. The graphical solutions development system implements the concept of probes and data viewers to permit the user to visually display a representation of the data on any wire or pin.

The term "Data viewers" refers to a set of software modules where individual viewer modules can be added and older viewers can be replaced with newer versions. Adding or replacing viewers can be done at any time after the GSDS is installed. Also, certain components may contain custom data viewers. In this case, the component, when it is instantiated in a drawing, may automatically add the viewer to the GSDS system.

Although conceptually it is easy to conceive of a data viewer providing a graphical representation of data, similar to an oscilloscope, a data viewer may provide substantially different capabilities as well. For example a data viewer may provide an interactive window where the user can modify or simulate various operating conditions. This means that a data viewer, in addition to being able to display the response at various points in a GSDS drawing, may also be able to provide stimulus to various points in a drawing.

FIG. 22A provides a screen shot 3900 of the GSDS showing a representative drawing for a dual-tone multi-frequency (DTMF) signal generator. In this drawing, two probes have been "inserted". An oscilloscope probe 3902 is attached to a wire. This connotes that data from this wire is available for any suitable viewer. A second probe 3906 has also been attached to a wire. This probe, denoted by the loudspeaker icon, forwards this data stream to an audio output device (e.g. a speaker). Probes provide a very convenient high-level debugging tool. Probes are invoked from appropriate toolbar buttons 3905 or from menu selections.

Figure 22B:
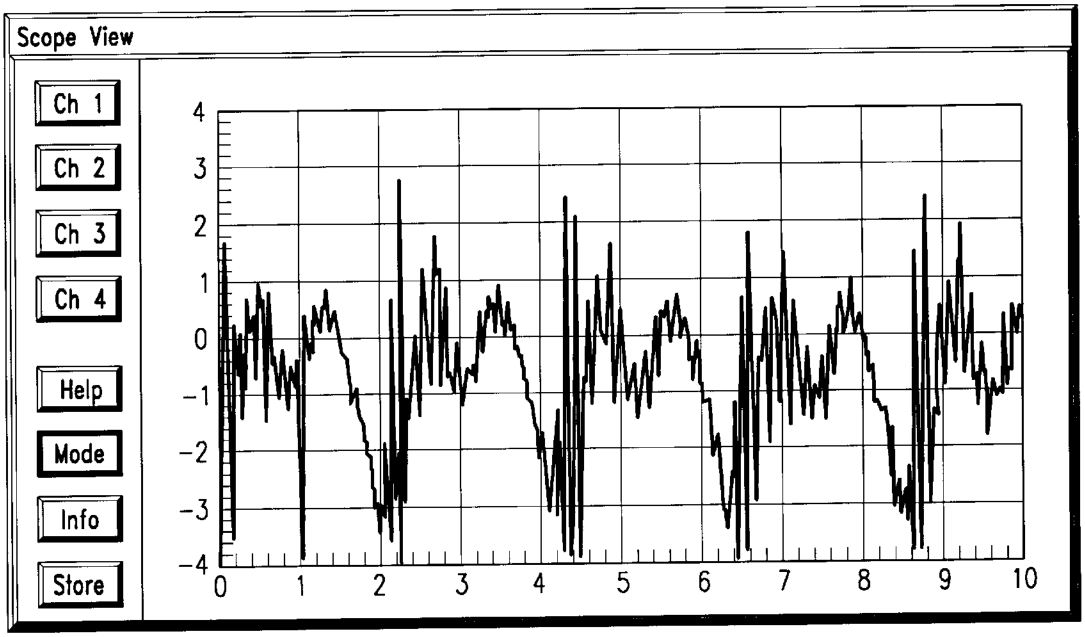
Figure 22C:
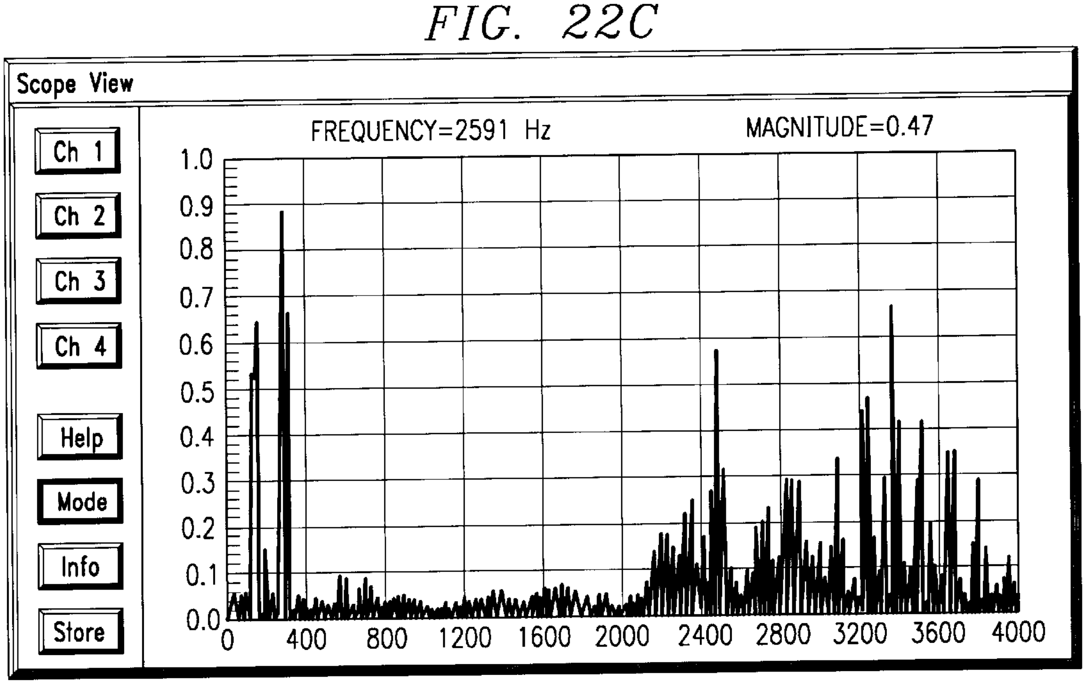

FIGS. 22B and 22C show typical data viewer screens. In this case, FIG. 22A provides a time-domain plot of the signal on the wire being probed, whereas FIG. 22B provides a spectral plot of the signal.

In general steps in building a project include sequentially adding blocks of components of various types to a drawing and connecting pins with wires. For example, a component X from a remote location via the Internet may have design help files, the change in parameters of component Y automatically changes parameters in component Z, and a framework may impose constraints on component W. Recall FIG. 8B illustrates basic connections and one block influencing parameters of another block.

The preceding has described how the GSDS leverages the intelligence of expert programmers and delivers powerful capabilities to both advanced and novice programmers. Many GSDS concepts extend to more generic situations as indicated in the following paragraphs.

Figure 24:
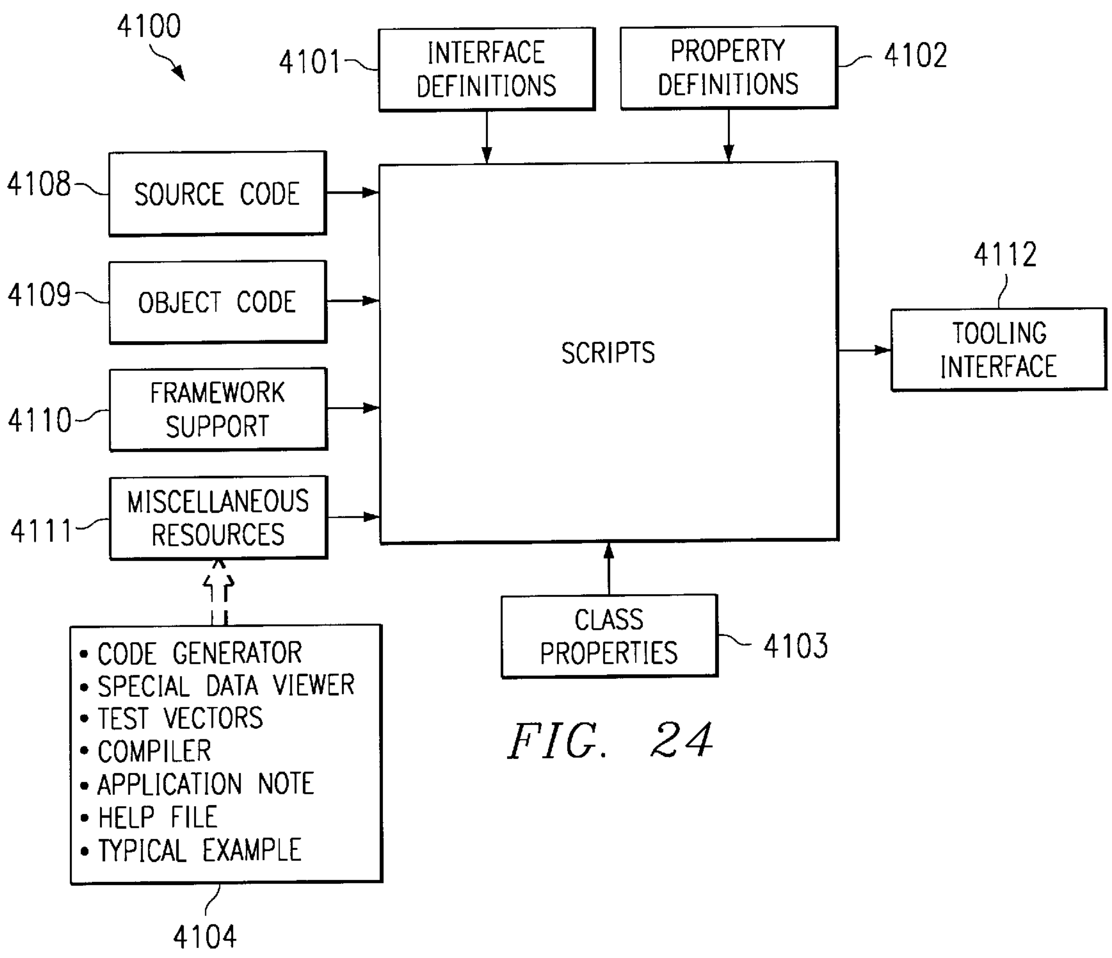
FIG. 24 shows the archive file structure.

The graphical solutions development software employs a standardized component architecture where a component may be considered as a single composite formed by the aggregation of many different resources. (In many cases, resources can be thought of as files.) These resources are stored in a single archive file, as illustrated in FIG. 24. Resources may be functionally segregated into several different categories including code modules, configuration modules, and other miscellaneous files and resources. The graphical solutions development system includes a "component resource" server that can locate and retrieve any resource in any component.

Code modules comprise all of the run-time resources stored in a component. These resources may include source code, assembly code, object code, libraries, objects, code fragments, etc. The final run-time code that ultimately gets deposited into a solutions project is usually constructed using a subset of these resources. Source code modules may be encrypted to protect the commercial interests of component designers.

A configuration module is a collection of all the script files, executables, code generators, etc. that are stored in and delivered with the component. This collection may include assemblers, compilers, linkers, or other specialized build tools. These modules may provide configuration dialogs or other design assistance. Via scripting these modules can gather design information from both the user and the current drawing. After gathering all pertinent information, the configuration modules construct a customized run-time file (or files) that is deposited into the appropriate solutions project (s). It is important to note that "customized run-time files" means that two instances of the same component in a single drawing may contribute completely different run-time code—depending on how they are used, what they are connected to, how their properties have been set, and other factors. The configuration modules are used primarily at design-time; hence these files are usually not part of the run-time code image.

Miscellaneous modules are any other resources that the component creator thought might be helpful to a user. These include help files, application notes, links to web sites, utilities, graphics, etc. These modules also represent design-time resources.

Components also contain a set of common properties referred to as "class" properties. Class properties are properties that every component is expected to maintain. These properties provide a set of standardized data that includes the component name, the component vendor, the revision number, the revision date, component description, as well as many other items. Most of these properties are set when the component is created and are "read only" after the component is published. The user may modify some class properties.

All of the resources that are included in a component are stored in a single archive file. If a user has a component archive file, then there is great certainty that all necessary component resources are available. This very clean approach to component deployment avoids a great many pitfalls and simplifies copying a component, deleting a component, moving a component, selling a component, etc. The entire component file strategy is optimized for web-based deployment.

A component can include many different resources (files). It would be cumbersome to have to unpack all these resources and move them to special directories. This would be prone to many errors during installation. Additional errors would be likely when trying to move, or delete a component. To simplify this situation, the graphical solutions development environment implements a component server that can fetch resources from any component. With this advancement, installation of components is reduced to simply coping it into the designated "component" directory. This eliminates setup; this eliminates configuration. Since it is a single file, it is very convenient to move it, copy it, delete it, etc.

Component files employ a unique naming convention that eliminates the possibility that different component designers might create different components but accidentally use the same name. Different components with the same name (a situation referred to as "name clashing") create confusion because a drawing may be expecting code from one but actually get code from a different (i.e. rogue) component. When a component is published (created), the component publisher creates a random name. This filename is based on a Global Universal Identifier (GUID). The use of GUID technology reduces the probability to less than once in a million years.

The purpose of a component is to encapsulate and deliver some useful functionality (e.g. demodulation, data encryption, filtering, etc.). A component is created by an expert to provide a desired operation. The challenge is to provide the most robust capability that will insure proper operation in every situation where this component may be invoked. If instead of using a component from the component gallery, an expert were called each time the component's functionality was needed, the expert would apply his own knowledge base of problem solving skills. Nominally, the expert explores the operating environment to determine what processor will execute the code, how much memory is available, what is the format of the incoming data, what is the data format required for subsequent processing operations, etc. After weighing all of this information along with the expert's personal experience, the expert can write the appropriate code for a specific component instance.

Unfortunately, when a component is created (published) it represents a fixed "package" of functionality that cannot be modified unless a revised edition of the component is published. This tends to limit and restrict the versatility of a component that, by definition, needs to properly interoperate with all other components in every case. The ideal solution would be for a component to encapsulate some of the expert's integration knowledge so that the component could instantiate itself in different ways depending on its operating environment. (The phrase "instantiate itself in different ways" means that the code that the component contributes to a solutions project might be different, might be optimized in some way, depending on factors external to the component.)

The graphical solutions development system comprehends and embodies the concept of a powerful scripting (programming) language. Scripts (i.e. programs) written using the scripting language may be included in a component. The scripting language provides transcendent functions which can provide visibility into "environmental" properties like what processor will execute this component's code, how much memory is available, what is the format of the incoming data, what is the format of the data required for subsequent processing operations, etc. The scripting language permits the expert (who creates a component) to embed a significant measure of his (or her) integration knowledge into the component. Based on the script's ability to interrogate the operating environment, the expert can embed integration knowledge to select (or build) the appropriate code modules and contribute them to the solutions project. The scripting language also provides a component with visibility into nearly every facet of the environment including processor capabilities, clock speed, memory properties, operating system properties, sampling rate, wire and pin information, task loading, as well as viewing and/or negotiation with all other components on a drawing. FIGS. 17G, 17H, and 17I provide clear examples of component scripts where the component engineer exercised the privilege of embedding personal expertise and integration knowledge into a component. Note: The term "capturing integration knowledge" is a generic concept. Every script represents the embedding or capturing of an expert's integration knowledge. Hence every script shown is a representative example of an expert delivering encapsulated expertise within the component. The OnProperty script of FIG. 17G delivers the expertise concerning which properties the user may want to be able to control. For this Sine wave generator the expert has decided that the user might like to be able to set the frequency and the amplitude. A different expert might consider other properties more important. Continuing this example, the OnDeposit script of FIG. 17H is used to copy the appropriate code files from the block to the project. Using this script, the expert delivers his expertise regarding which files are needed (based on user-configured property settings) and his expertise regarding which folders the various files should be copied into. And lastly, the OnAssemble script of FIG. 17I delivers the expert's knowledge of how to pass data or events from one component to another (in accordance with the wires that interconnect the various components). In almost every case, a script will be delivering a nugget of expertise that the component designer deemed to be important. Note that this helps create a competitive environment where one component designer can try to offer improved components with the only improvement in the scripts rather than in the actual DSP code modules.

FIG. 23 gives the listing of a function called AutoName 4000 to illustrate how a script may query the environment (in the particular case, the drawing environment) to determine how to achieve a desired result. This function may be included in a component so that when it is instantiated in a drawing that it can automatically pick a suitable unique name. A "short name" is passed to this function when it is called. The "short name" is an abbreviation for the component; for example the "short name" for a Sine Wave Generator might be "SIN". The purpose of this function is to analyze the drawing and count how many instances of the current component there are (e.g. SIN1, SIN2, and SIN3) and automatically generate the proper unique name for the current instance (SIN4). To perform this task, the component must seek information that is outside of the component, i.e. it must examine the environment that it is being placed in. This process begins with statement 4002 where the components queries for a pointer to the current drawing. Code statement 4003 queries for the total number of blocks currently on the drawing. Statement 4004 seeks a pointer to the current block, and statement 4005 queries for the name of the component of which this block is an instance. The software loop 4006 creates an iterative process where each block on the drawing is queried to see how many instances of this same component exist. During each iteration of the loop, the statement 4007 gets a pointer to the next (the "j-th") block. An "if" statement 4008 checks to see if the GUID (i.e. the name) of the current block matches the GUID of the "j-th" block. For each match, an instance-count variable (named "Comps") is incremented. The "AutoName" function returns a string that is the concatenation of the "short name" and the instance count.

Scripting provides capabilities for achieving compatibility (i.e. interoperability) as well as optimization based on user-defined goals. Specific capabilities (enabled via scripting) that may be useful include elimination of parameter range-checking, elimination of data format conversions, re-linking selected code modules, patching code fragments into object modules, etc.

Component scripts can be executed at design-time, at build time, or at run-time (or any combination). There are a host of other design time "events" which may be used to invoke scripts. These include a property-change event, a new-wire event, a new-probe event, and many others.

The expert who creates a component may decide to write the component's code in four different ways. All four code modules can be placed inside a single component at the time that it is published. However when the component is used, the component scripts determine precisely which code module(s) will provide the optimum functionality, and only those modules are contributed to the solutions project.

Although scripts can enhance component functionality, components are not required to have scripts. Also, scripts are one way that a component can "advocate" new rules to the framework.

The ultimate goal of the graphical solutions development system is to convert a user-generated block diagram on a drawing into real and efficient processor instructions (i.e. a code module) and load this code module onto a real piece of hardware. To properly perform this conversion process, a good bit of information is needed regarding the actual hardware where the code will be executed. Things that are important at build-time may include: processor type, processor speed, memory map, memory speed, the types, locations and properties of I/O ports, the properties of the software kernel, the properties of the real time operating system (RTOS), debugging information, utilities for testing, special compilers or other code-generation tools, and framework rules that apply to this specific hardware implementation.

There needs to be a simple way to capture all of this information and make it easily accessible both to the graphical solutions development system as well as to all components on the drawing. In an embodiment, this is resolved by abstracting the platform as a component. A platform component is similar to other components in that it is represented as a block on a drawing, and it can contain many different files. The platform component contains a description of all of the hardware features. This description is captured in a compatible file format so that this information is available to the visual drawing editor for on-the-fly rule checking during the design process.

Placing all of the relevant information for a given hardware platform in a platform component solves many problems. In a drawing this serves as a single repository for all hardware information. Because the platform information is implemented as a component in the drawing, all other components in the drawing have access through the power of the scripting language.

The graphical solutions development environment includes the concept of a specialized "component publisher" utility specifically designed and optimized to publish "platform components". This utility uses the same paradigm as components, has access to any needed resources, and can be queried from scripts.

Regarding frameworks, the data that comprise the rules and the rule engine may be physically distinct, or they may be "hard-coded" into an integrated implementation.

A hard-coded implementation makes it more difficult to change rules, but this disadvantage is offset by enhanced execution speed.

FIG. 19A gives a listing of several possible framework rules that pertain to blocks. Each rule is assigned a "Rule Number" that is a convenient reference designator. The first rule, "B000", states that every block on a drawing must have a solutions project attribute. Because the GSDS only understands how to "build" and "run" projects, any block that intends to participate must have a proper designation indicating to which project it is assigned.

The script code shown in FIG. 19B implements a function that verifies whether or not, for all the blocks in a given project, rule "B000" is satisfied. Code section 2901 queries the GSDS to determine how many blocks are currently in the project. Code section 2902 initiates a software loop that enumerates each block in the project. Code section 2903 calls the "VerifyAttributeExists" API to determine if each block has a "project" attribute. This example script demonstrates how a software function can be constructed to verify that a rule is satisfied.

In FIG. 19C, the listing illustrates that a software subroutine can be implemented to iterate through the entire set of "block" rules. In this simple example, each rule violation generates an error message to the user. There are many alternate methods of handling errors including logging them in a file, automatically correcting them, etc.

A complete framework example is provided in FIG. 19D. This framework script code sequentially calls subroutines that verify rules for the workspace, the project, the blocks, and the wires. This simple example is somewhat deceptive. If a more robust framework were invoked to "examine" a non-trivial drawing, the verification process might involve hundreds or thousands of rule-checks. Without the advantage of an automatic rule-checker, it might take an expert programmer hours or days to locate just one rule violation. Thus the framework provides a very potent capability.

Even though a framework may be implemented using "hard-coded" routines, the framework may be partitioned into separate sets of rules. Each set of rules may focus on rules that pertain to one aspect of a drawing, for example: blocks. Further, it is possible that the code that checks a given set of rules be collected into separate framework modules. This leads to the concept of a framework "executive" routine that can call individual framework modules as needed. As shown in FIG. 19E, framework modules can be arranged in a hierarchy. Various modules in the hierarchy may be replaced depending on specific drawing conditions. Consider a drawing where one portion of the drawing pertains to motor control, and another section of the same drawing pertains to speech recognition. (These differences in focus are sometimes referred to as different "problem domains".) In this example it is quite likely that the set of rules for wires in the motor control area will be different from the set of wire rules that apply to the speech recognition "circuitry". A framework executive is able to call the appropriate wiring-rule module depending on which section of the drawing is being analyzed. The exact arrangement of the framework modules in the framework hierarchy may differ substantially from the example given in FIG. 19E.

In some instances a block may recommend a specific framework to govern its operation. In other instances it may contribute its own set of rules that guarantee correct results.

Specialized (custom) versions of the GSDS may be designed with the framework "hard coded" into the GSDS code. In this case, the framework would be fixed and immutable. In other case, the framework may be a distinct module that can be replaced by the user. In yet another case, the framework may be implemented as components that appear in a drawing.

The benefits of frameworks include: making life easier for beginners; reducing and/or eliminating errors; improving performance, and encapsulating intellectual property.

It is important to note that frameworks may also be components; frameworks may be aggregates of frameworks; and components may add rules to a framework.

The Component Object Model (COM) is a Microsoft standard that is designed to facilitate how software components can interoperate in a generalized or generic way. This is a very powerful standard, and is used to provide unique capabilities. Further, because the GSDS has a view into the drawing, the framework, and the platform, COM can be slightly modified or extended to provide many substantial benefits. In FIG. 22A, the event wires (between the component-instance blocks and the COM (Server) block) 3903 are implemented using COM technology. The wire connecting the Host Application (not shown in FIG. 22A) to Com Server block 3903 is also implemented using Com technology. The following comments pertain to the way that COM is used and implemented in the GSDS:

- A drawing can automatically generate a COM interface server that provides the host application with a custom interface to every event wire in the drawing.
- Every event wire that is connected to the COM Server 3903 block defines a portion of the COM interface that is created.
- There are three types of interfaces that can be added: scalars, function values, and COM interfaces.
- The GUID of the COM object represents the actual target code that the drawing generates.
- The interface GUID corresponds to the unique interface that the host uses to communicate with the COM object.
- Subsequent changes to the event wires in the drawing will modify the interface to the host.
- Both input events and output events of a DSP component can be modeled using COM.
- Components' input events add methods and/or interfaces to the COM object
- Components' output events add COM events to the COM object
- The COM threading models are extended for asymmetric processing
- Since we are generating a custom interface for a DSP target, we can create custom interfaces that are optimized for the specific hardware. (Especially for shared memory model.) This was previously discussed in section on events.
- Normally COM interfaces generate specific code for each method exposed, but has access to system and context knowledge it can generate much more efficient methods than a generic approach. This typically enhances execution speed.
- To accommodate the real-time nature of DSP processing COM needs can extend COM. This requires synchronization of processing tasks and other optimizations.

COM is a standard that is used by a million Windows programmers every day. (Note that Microsoft defines a COM component slightly differently than the way we define a Component.) COM provides very significant benefits of: 1) provides a standard for how to write COM components, 2) COM components are used in a standard way, regardless if they are running on the same processor, or are running on different kinds of processors at remote locations, 3) COM components can be written in any language, 4) COM includes optional security protocols, and 5) compatible with a variety of network protocols. By using COM as an interface to DSP Components and DSP drawings, it permits a million programmers to access complex DSP technology without having to learn anything new. This permits them to use familiar techniques to add incredible new features that are only available from DSP. The fact that the GSDS leverages COM gives them access to DSP with them having to spend several

What is claimed is:

1. A method for creating a component for use in software library having a plurality of such components, comprising:

accepting a plurality of resources for a unit of primary functionality wherein a first resource of the plurality of resources comprises a code module and a second resource of the plurality of resources comprises a configuration module, the configuration module comprising an executable script;

packaging the plurality of resources in an archive file to form the component; and adding the component to the software library.

2. The method of claim 1 wherein executable script of the configuration module is operable to provide configuration assistance for adapting the code module for use in a software application when the component is included in the software application.

3. The method of claim 2 wherein the code module comprises source code.

4. The method of claim 3 wherein the configuration module further comprises a tool for converting the source code to object code.

5. A graphical solutions development system, comprising:

a main memory system holding a graphical solutions development tool program;

a main computer system connected to the main memory system, the main computer system operable to execute the graphical solutions development tool program;

a target processing system; and means for connecting to the target processing system wherein the graphical solutions development tool is operable to support the creation of an application program for the target processing system from a software library having a plurality of user-selected components where the method for creating a component of the plurality of user-selected components comprises:

accepting a plurality of resources for a unit of primary functionality wherein a first resource of the plurality of resources comprises a code module and a second resource of the plurality of resources comprises a configuration module, the configuration module comprising an executable script;

packaging the plurality of resources in an archive file to form the component; and adding the component to the software library.

6. The graphical solutions development system of claim 5 wherein the graphical solutions development tool is operable to create the application program responsive to a configuration module of each of the plurality of user-selected components within the software library.

7. A method for designing a software application comprising a plurality of components using a graphical solutions development system comprising the steps of:

displaying a graphical representation of a first user-selected component;

displaying a graphical representation of a second user-selected component;

drawing a first line connecting the first component to the second component responsive to user input directing that the first line be drawn wherein the first line represents the flow of data between the first component and the second component; and drawing a second line connecting the first component to the second component responsive to user input directing that the second line be drawn wherein the second line represents the flow of control information between the first component and the second component.

8. The method of claim 7 wherein the first line is given a first unique visual appearance denoting that the first line represents the flow of data and the second line is given a second unique visual appearance denoting that the second line represents the flow of control information.

9. A method for creating a software application using a graphical solutions development system comprising the steps of:

displaying a first graphical representation of a first user-selected component comprising first source code and an executable configuration script;

displaying a second graphical representation of a second user-selected component comprising second source code and an executable configuration script;

accepting user input connecting the first graphical representation and the second graphical representation;

configuring the first source code automatically for use in the software application by executing the configuration information of the first component responsive to the presence of the second component; and configuring the second source code automatically for use in the software application by executing the configuration information of the second component responsive to the presence of the first component.

10. The method of claim 9 further comprising the step of creating a proxy and a stub automatically for communication between the first configured source code and the second configured sourced code.

11. A method for creating a component for use in software library having a plurality of such components, comprising:

accepting a plurality of run-time resources for a unit of primary functionality;

accepting a plurality of configuration resources for the unit of primary functionality, wherein at least one of the configuration resources is an executable script; and packaging the plurality of run-time resources and the plurality of configuration resources in an archive file.

12. The method of claim 11 wherein the plurality of run-time resource comprise a plurality of source files.

13. A method for creating a software application using a graphical solutions development system comprising the steps of:

displaying a first graphical representation of a first user-selected component comprising a first plurality of run-time resources and a first plurality of configuration resources comprising at least a first executable configuration script;

displaying a second graphical representation of a second user-selected component comprising a second plurality of run-time resources and a second plurality of configuration resources comprising at least a second executable configuration script;

accepting user input connecting the first graphical representation and the second graphical representation;

creating the software application automatically wherein the application comprises:

a first portion of object code resulting from the execution of the first configuration script to a first run-time resource of the first plurality of run-time resources wherein the first configuration script is selected responsive to the design of the software application; and a second portion of object code resulting from the execution of the second configuration script to a second run-time resource of the second plurality of run-time resources wherein the second configuration script is selected responsive to the design of the software application; and wherein those portions of the first and second pluralities of run-time resources and the first and second pluralities of configuration resources not required in the software application are not made part of the application.

* * * * *